(12) United States Patent
Shearman et al.

(10) Patent No.: US 11,617,285 B2
(45) Date of Patent: Mar. 28, 2023

(54) HARDENED, TELECOMMUNICATIONS CLAMSHELL PLATFORM WITH HEAT LOAD SHARING BETWEEN BOTH HALVES OF THE PLATFORM

(71) Applicant: Ciena Corporation, Hanover, MD (US)

(72) Inventors: Simon J. E. Shearman, Ottawa (CA);
Michael R. Bishop, Ottawa (CA);
Marko Nicolici, Ottawa (CA);
Chander Prakash Gupta, Gurgaon (IN)

(73) Assignee: Ciena Corporation, Hanover, MD (US)

( * ) Notice: Subject to any disclaimer, the term of this patent is extended or adjusted under 35 U.S.C. 154(b) by 81 days.

(21) Appl. No.: 17/246,886

(22) Filed: May 3, 2021

(65) Prior Publication Data
US 2022/0304193 A1 Sep. 22, 2022

(30) Foreign Application Priority Data

Mar. 19, 2021 (IN) .............................. 202111011744

(51) Int. Cl.
H05K 7/20 (2006.01)
H05K 7/14 (2006.01)

(52) U.S. Cl.
CPC ....... H05K 7/20509 (2013.01); H05K 7/1427 (2013.01); H05K 7/20336 (2013.01)

(58) Field of Classification Search
CPC .................................................. H05K 5/0217
See application file for complete search history.

(56) References Cited

U.S. PATENT DOCUMENTS

| | | |
|---|---|---|
| 5,731,956 A | 3/1998 | Nicolici |
| 6,104,611 A | 8/2000 | Glover et al. |
| 6,166,919 A | 12/2000 | Nicolici et al. |
| 6,376,779 B1 | 4/2002 | Shearman et al. |
| 6,426,876 B1 | 7/2002 | Shearman et al. |
| 6,466,724 B1 | 10/2002 | Glover et al. |
| 6,512,679 B1 | 1/2003 | Shearman et al. |
| 6,545,850 B1 | 4/2003 | Shearman et al. |
| 6,570,762 B2 | 5/2003 | Cross et al. |
| 6,888,069 B1 | 5/2005 | Chen et al. |
| 6,948,968 B1 | 9/2005 | Shearman et al. |
| 7,043,130 B2 | 5/2006 | Ng et al. |
| 7,123,807 B2 | 10/2006 | Ng et al. |
| 7,145,773 B2 | 12/2006 | Shearman et al. |
| 7,327,576 B2 * | 2/2008 | Lee ........................... G06F 1/20 174/15.2 |
| 7,331,532 B2 | 2/2008 | Currie et al. |
| 7,579,718 B2 | 8/2009 | Aziz et al. |
| 7,855,891 B1 * | 12/2010 | Ayres, III .......... H05K 7/20445 174/547 |

(Continued)

FOREIGN PATENT DOCUMENTS

WO 2019209522 A1 10/2019

*Primary Examiner* — Mukundbhai G Patel
(74) *Attorney, Agent, or Firm* — Baratta Law PLLC; Lawrence A. Baratta, Jr.

(57) ABSTRACT

An outdoor, hardened telecommunications clamshell platform includes a base half and a top cover half. The platform also includes a Printed Circuit Board (PCB) disposed between two cooling plates within the platform, and a heat distributing mechanism surrounding the PCB within the platform and configured to distribute heat substantially evenly between the base half and the top cover half.

17 Claims, 20 Drawing Sheets

(56) References Cited

U.S. PATENT DOCUMENTS

| | | | |
|---|---|---|---|
| 8,154,867 B2 | 4/2012 | Shearman et al. | |
| 9,492,914 B2 | 11/2016 | Ng et al. | |
| 9,603,289 B1 | 3/2017 | Shearman et al. | |
| 9,769,959 B2 | 9/2017 | Mayenburg et al. | |
| 9,820,403 B2 | 11/2017 | Shearman et al. | |
| 10,070,553 B2 | 9/2018 | Lee et al. | |
| 10,104,799 B2 | 10/2018 | Shearman et al. | |
| 10,353,163 B1 * | 7/2019 | Hanks | G02B 6/4448 |
| 10,440,852 B1 | 10/2019 | Shearman et al. | |
| 10,674,241 B2 | 6/2020 | Rivaud et al. | |
| 10,729,037 B1 | 7/2020 | Shearman et al. | |
| 10,924,324 B2 | 2/2021 | Rivaud et al. | |
| 2003/0184974 A1 | 10/2003 | Atkinson et al. | |
| 2005/0047074 A1 | 3/2005 | Shearman | |
| 2005/0074990 A1 | 4/2005 | Shearman et al. | |
| 2005/0075001 A1 | 4/2005 | Shearman et al. | |
| 2005/0276017 A1 | 12/2005 | Aziz et al. | |
| 2007/0114056 A9 | 5/2007 | Cosman et al. | |
| 2019/0327188 A1 | 10/2019 | Rivaud et al. | |

* cited by examiner

MGT external cabling 50

PS INPUT external cabling 50

114 — A PROCESS OF DISTRIBUTING HEAT SUBSTANTIALLY EVENLY BETWEEN A BASE HALF 32 AND A TOP COVER HALF 34 OF AN OUTDOOR, HARDENED TELECOMMUNICATIONS CLAMSHELL PLATFORM 12 COMPRISES:

116 — PROVIDING THE BASE HALF 32 AND THE TOP COVER HALF 34 OF THE OUTDOOR, HARDENED TELECOMMUNICATIONS CLAMSHELL PLATFORM 12, EACH HALF HAVING OUTER FINS 36 THEREON

118 — PROVIDING A PCB 52 DISPOSED BETWEEN TWO COOLING PLATES 54, 56 WITHIN THE PLATFORM 12

120 — PROVIDNG A HEAT DISTRIBUTING MECHANISM 58 SURROUNDING THE PCB 52 WITHIN THE PLATFORM 12, WHEREIN THE HEAT DISTRIBUTING MECHANISM 58 DISTRIBUTES THE HEAT SUBSTANTIALLY EVENLY BETWEEN THE BASE HALF 32 AND THE TOP COVER HALF 34 OF THE OUTDOOR, HARDENED TELECOMMUNICATIONS PLATFORM 12

*FIG. 27*

HARDENED, TELECOMMUNICATIONS CLAMSHELL PLATFORM WITH HEAT LOAD SHARING BETWEEN BOTH HALVES OF THE PLATFORM

FIELD OF THE DISCLOSURE

The present disclosure generally relates to networking equipment. More particularly, the present disclosure relates to an outdoor hardened, telecommunications or optical platform with pluggable optics, and thermal management thereof.

BACKGROUND OF THE DISCLOSURE

The growing number of Internet connections, ever-faster media streaming devices and the escalation of high-definition mobile video are just some of the factors burdening already overtaxed cable networks. In the cable world, these applications require huge amounts of bandwidth coupled with low latency. The supporting infrastructure must also offer the flexibility to cope with steadily increasing dynamic traffic flows. Accordingly, most cable operators are looking to a "Fiber Deep" architecture, which is an end-to-end solution combining packet switching and aggregation alongside coherent optical technology. In this case, Hybrid Fiber Coax (HFC) architectures are transformed and coexist with modern digital fiber and packet technologies. The term "Fiber Deep" has been used to describe an approach that empowers a forward-looking, universal access framework that includes Data Over Cable Service Interface Specification (DOCSIS), Remote PHY devices (RPD), point-to-point 10G, and higher fiber-based business services, variants of Passive Optical Network (xPON), small cells and finally Converged Haul 4G and 5G New Radio (NR) mobility futures.

Additionally, thermal management for high-speed optical networking equipment is a challenge. In a controlled environment, thermal management is achieved through air flow, vents in a chassis, fans, design choices, etc. For example, some work has focused on managing air flow to enable back-to-back shelf configurations, i.e., front or side airflow only, which is advantageous in Central Offices (CO), data centers, etc. However, these deployments are all in a controlled environment, e.g., air conditioning, no exposure to the environment, etc.

The use of pluggable optical modules is common in high-speed optical networking equipment deployed in a controlled environment. Numerous techniques for thermal management of pluggable optical modules exist, but they focus primarily on keeping the pluggable optical modules cool, such as by forced air flow driven by cooling fans over heatsinks.

Outside plant equipment that is deployed in sealed housings (i.e., hardened) can operate in both high ambient temperature conditions and low ambient temperature conditions. With no air flow around the module or other components therein, heat must somehow be conducted to the housing. However, pluggable optical modules have a minimum operating case temperature, ranging from +20° C. at the high end through −5° C. for some modules and down to −20° C. for some high-performance modules, and thus, continued heat dissipation can result in case temperatures below the minimum in low ambient temperature conditions. Successful operation of a pluggable optical module in a poorly controlled or uncontrolled environment therefore requires both increased heat dissipation to keep the module at or below its maximum operating temperature in average and high ambient temperature conditions and increased thermal resistance to ambient while operating in low ambient conditions to keep the module at or above its minimum operating temperature.

Additionally, even with smaller, outside plant equipment not generating a significant amount of power, there is still a concern as such sealed housings can also heat up quickly, especially when taking into account solar loads, etc.

Moreover, product designs in this space can also be categorized as including a single Printed Circuit Board (PCB) inside a hardened enclosure wherein all heat will be dissipated by one half of the enclosure only, thereby adversely impacting size, weight and cost of the part; or multiple PCBs inside a hardened enclosure wherein these PCBs dissipate disproportional heat load and in such a scenario all enclosure surfaces are not equally participating in heat transfer to ambient.

Many designs have multiple PCBs, often two, which are mounted on both halves of an enclosure and in such instances the thermal load is not equal on both halves. This results in more thermal load on one half and less on the other half. When there is a single PCB dissipating heating, there is no mechanism to transport heat from one half to another half as all heat comes on one half and the other half does not contribute to heat dissipation. This impacts size and weight of the parts.

Embodiments of the invention address the foregoing concerns and others.

BRIEF SUMMARY OF THE DISCLOSURE

In an embodiment, an outdoor, hardened telecommunications clamshell platform (12) includes a base half (32) and a top cover half (34), configured to dissipate heat; a Printed Circuit Board (PCB) (52) disposed between two cooling plates (54, 56) that are enclosed by the base half (32) and the top cover half (34); and a heat distributing mechanism (58) surrounding the PCB (52) configured to distribute heat substantially evenly between the base half (32) and the top cover half (34). The base half (32) can be configured to initially receive the heat from the PCB (52) and the heat distribution mechanism (58) is configured to then distribute the heat to the top cover half (34). The heat distributing mechanism (58) can be selected from the group consisting of a heat pipe, pumped fluid, a vapour chamber, a thermosyphone, and a loop heat pipe. The heat distributing mechanism (58) can be a heat pipe. The heat distributing mechanism (58) can include a plurality of sections (60, 64, 70, 74) and a plurality of segments (68, 88).

The heat distributing mechanism (58) can include a first section (60) attached to an end (62) of the primary side cooling plate (54), a first elongated section (64) extending along a side length (66) of the primary side cooling plate (54), a first bend segment (68), a second elongated section (70) extending along a side length (72) of the secondary side cooling plate (56), a second section (74) attached to an end (76) of an underside of the secondary side cooling plate (56); and wherein the first bend segment (68) and the second bend segment (88) each extend past the primary side cooling plate (54), the secondary side cooling plate (56) and the PCB (52), and the heat pipe is fully enclosed by the hardened optical clamshell platform (12). At least two spring guiding standoffs (98) can be located on the PCB (52) below the primary side cooling plate (54) to support the primary side cooling plate (54) for thermal contact, and a spring support (100) is located on the primary side cooling plate (54) supporting each guiding standoff (98).

Each of the spring guiding standoffs (98) can go through the PCB (52) to be attached to the secondary side heatsink supports (55) for tolerance mitigation; and fasteners (102) can attach the PCB (52) to the secondary side cooling plate (56). The outdoor, hardened telecommunications clamshell platform (12) can include a thermal pad (104) coupled to the secondary side cooling plate (56). The base half (32) can be configured to initially receive the heat from the PCB (52) and the heat distribution mechanism (58) is configured to then distribute the heat to the top cover half (34) such that the heat is distributed substantially evenly between the base half (32) and the top cover half (34). The heat distributing mechanism (58) can be routed in a loop between surfaces of the two cooling plates (54, 56) making contact therewith.

In another embodiment, a thermal control system (108) for pluggable optics and a Printed Circuit Board (PCB) (52) in an outdoor, hardened telecommunications clamshell platform (12), the thermal control system (108) includes a heatsink assembly (110) for dissipating heat from the PCB (12), wherein the hardened telecommunications clamshell platform (12) comprises a base half (32) and a top cover half (34); the heatsink assembly (110) includes a primary side cooling plate (54) having a primary side underside; a secondary side cooling plate (54) having a secondary side underside; a spring guiding standoff (98) attached on each end of the underside of the primary side cooling plate (62); a heat distributing mechanism (58) coupled to the primary side cooling plate (54) and the secondary side cooling plate (56) and surrounding the PCB (52); the Printed Circuit Board (PCB) (52) located between the primary side cooling plate (54) and the secondary side cooling plate (56), wherein each spring guiding standoff (98) goes through the PCB (52) to attach the primary side cooling plate (54) to the PCB (52).

The heat distributing mechanism (58) can be a heat pipe. The heat distributing mechanism (58) can include a first section (60) attached to an end (62) of the primary side cooling plate (54), a first elongated section (64) extending along a side length (66) of the primary side cooling plate (54), a first bend segment (68), a second elongated section (70) extending along a side length (72) of the secondary side cooling plate (56), a second section (74) attached to an end (76) of an underside of the secondary side cooling plate (56); and a third section (80) attached to an end (82) of the primary side cooling plate (54) and aligned with the first section (60), a third elongated section (84) extending along a side length (86) of the primary side cooling plate (54) opposite and parallel to the first elongated section (64), a second bend segment (88) parallel to the first bend segment (70), a fourth elongated section (90) extending along a side length of the secondary side cooling plate (56) opposite the second elongated section (70), a fourth section (94) attached to an end (96) of the underside of the secondary side cooling plate (56) and aligned with the second section (74), wherein the first bend segment (68) and the second bend segment (88) each extend past the primary side cooling plate (54), the secondary side cooling plate (56) and the PCB (52), and the heat pipe is fully enclosed by the hardened optical clamshell platform (12). The base half (32) can be configured to initially receive the heat from the PCB (52) and the distribution mechanism (58) can be configured to then distribute the heat to the top cover half (34). The heat distributing mechanism (58) can be routed in a loop between surfaces of the two cooling plates (54, 56) making contact therewith.

In a further embodiment, a method of distributing heat substantially evenly between a base half (32) and a top cover half (34) of an outdoor, hardened telecommunications clamshell platform (12) includes providing the base half (32) and the top cover half (34) of the outdoor, hardened telecommunications clamshell platform (12); providing a Printed Circuit Board (PCB) (52) disposed between two cooling plates (54, 56) within the platform (12); and providing a heat distributing mechanism (58) surrounding the PCB (52) within the platform (12), wherein the heat distributing mechanism (58) distributes the heat substantially evenly between the base half (32) and the top cover half (34) of the hardened telecommunications platform 12.

The heat distributing mechanism (58) can be a heat pipe. The heat distributing mechanism (58) can include a first section (60) attached to an end (62) of the primary side cooling plate (54), a first elongated section (64) extending along a side length (66) of the primary side cooling plate (54), a first bend segment (68), a second elongated section (70) extending along a side length (72) of the secondary side cooling plate (56), a second section (74) attached to an end (76) of an underside of the secondary side cooling plate (56); and wherein the first bend segment (68) and the second bend segment (88) each extend past the primary side cooling plate (54), the secondary side cooling plate (56) and the PCB (52), and the heat pipe is fully enclosed by the hardened optical clamshell platform (12). The base half (32) initially receives the heat from the PCB (52) and the heat distribution mechanism (58) then distributes the heat to the top cover half (34).

BRIEF DESCRIPTION OF THE DRAWINGS

The present disclosure is illustrated and described herein with reference to the various drawings, in which like reference numbers are used to denote like system components/method steps, as appropriate, and in which:

FIG. 27 is a flow diagram of a process of distributing heat substantially evenly between a base half and a top cover half of an outdoor, hardened telecommunications clamshell platform.

DETAILED DESCRIPTION OF THE DISCLOSURE

Figure 1:
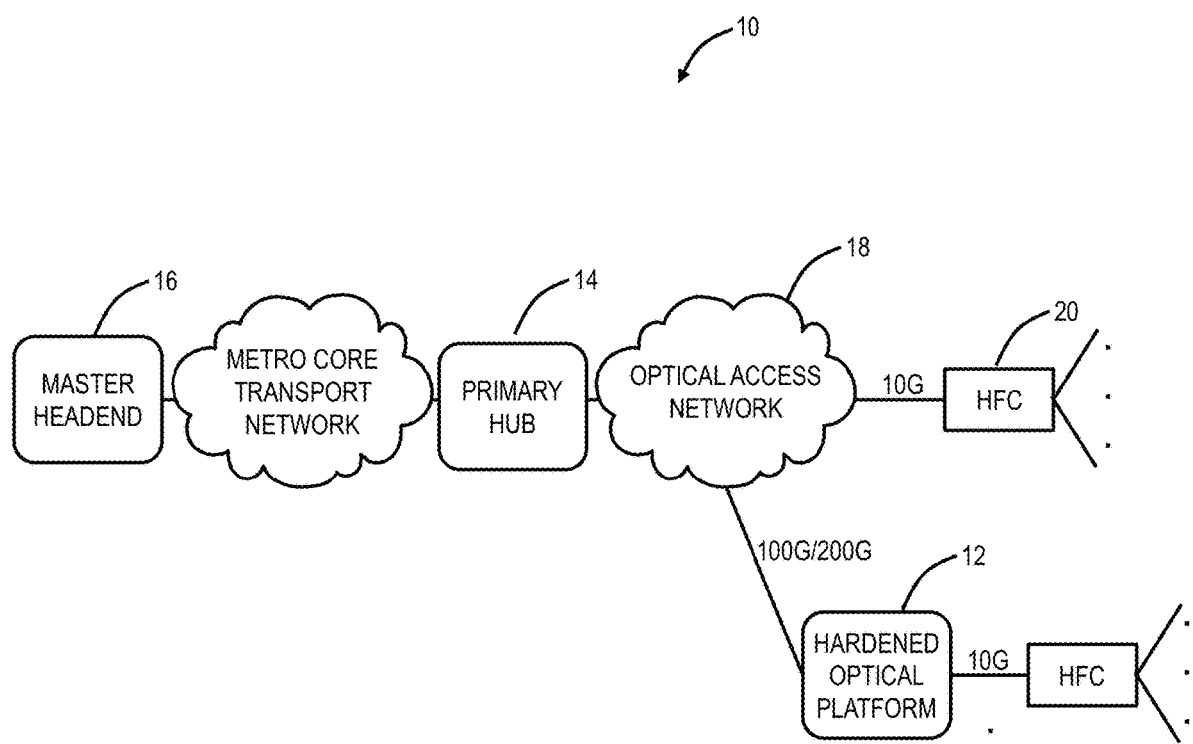
FIG. 1 is a network diagram of a network utilizing a hardened optical platform in a so-called "Fiber Deep" architecture.

In various embodiments, the present disclosure relates to optical or telecommunications platforms, such as hardened optical platforms with, e.g., pluggable optics, a PCB, and/or associated components, and a thermal control system or method for cooling thereof. The platforms contemplate deployment in an outdoor plant system or the like. By hardened, the hardened platform is designed to be placed anywhere in the telecommunications environment, including any climate and any outdoor or indoor mounting, and is especially suited for the outdoor environment. Thus, the hardened platform is sealed from harmful ingress, such as water. It is durable from corrosion, even in high-salt environments. The hardened platform does not have air flow, vents, etc. permitting air exchange with the exterior and thus cooling of the components within the platform. Thus, this is the challenge addressed by embodiments of the present invention, and the inventors have advantageously determined how to distribute the thermal load substantially evenly to both halves of the hardened platform, as well as have the heat dissipated by both halves of the enclosure.

In various embodiments, the present disclosure further relates to an outdoor telecom product enclosing high power electro-optics, fiber managers and heat dissipating elements. In embodiments, the product may operate in an outdoor environment up to, e.g., 46 degrees Celsius along with solar load, as specified in IP67, which is a telecom/datacom specification for outdoor equipment. Embodiments also provide a system and method to cool high and low power devices sharing the thermal load between two hardened, clamshell halves of the sealed housing (hardened optical or telecommunications platform), thus reducing the overall size and weight required if the cooling was not shared between the two clamshell halves. Such enclosures can be made of aluminum die cast parts, which help transfer heat from the PCB and any associated components to ambient.

In various embodiments, the afore-referenced thermal challenge is offset with a custom design of a heat pipe (or other heat distributing mechanism, as further described below) that shares the load between the two enclosure halves. For instance and as further detailed below, various embodiments advantageously include, e.g., one or more of the following features: fasteners pulling the secondary side (SS) cooling (cold) plate onto the clamshell for good thermal contact; a copper or other metallic heat pipe connecting the two halves on one side for increased flexibility and tolerance acceptance; springs going through the PCB to be attached/referenced on the primary side of the PCB for tolerance mitigation; attachment of the heat pipe(s) to the opposite end of the cold plate on the SS side (i.e., if they come out on the left they get attached to the very right of the SS cold plate thereby making the heat pipe(s) longer allowing sufficient flexing to take up tolerance; and springs serving the role of only holding the SS cold plate in place before it is assembled and pulled by fasteners (sealed) onto the clamshell.

As described below, further advantages of embodiments of the invention include a lower cost design, better return on investment (ROI); less weight and size; better thermal performance, hence better reliability; and potential scalability and applicability to other products/product roadmap.

Coherent Optics

Coherent optical technology uses a Digital Signal Processor (DSP) at both the transmitter and receiver, higher bit-rates, providing greater degrees of flexibility, simpler photonic line systems, and better optical performance. Fiber types and fiber impairments can be compensated for, leading to fewer regenerators and amplifiers, lowering costs, increasing transmission distances and adding traffic-handling capacity. Coherent optics can be implemented in either an integrated or pluggable optical module form factors. In the integrated approach, vendors customize solutions with their own technology and benefits. Pluggable coherent technologies can be split into two basic types: Analog Coherent Optics (ACO) and Digital Coherent Optics (DCO). ACOs consume less power by removing DSP functionality (and its hardware) from the pluggable optical module. The pluggable optical module communicates with the carrier circuit board using analog signals via a special connector and is where the DSP functionality resides. DCOs have the DSP function embedded within the pluggable optical module. This approach makes them more compatible with other vendors but consumes more power and has less vendor-specific technology.

For its part, coherent packet-optical combines the power of coherent optical transmission technology with packet fabric-based switching. It simplifies the network design and operations by eliminating the cost and complexity associated with deploying separate and physically distinct packet and optical platforms. It also facilitates future Distributed Access Architecture (DAA) and legacy Converged Cable Access Platform (CCAP) support.

"Fiber Deep"

FIG. 1 is a network diagram of a network 10 utilizing a hardened optical or telecommunications platform 12 in a so-called "Fiber Deep" architecture. Generally, the "Fiber Deep" architecture relates to including coherent optics closer to end users, including in outside plant configurations requiring the hardened optical platform 12. That is, the "Fiber Deep" architecture includes movement of fiber ever closer to customers requiring placement of the hardened optical platform 12 in non-controlled environments, i.e., outdoors.

The hardened optical platform 12 enables the use of pluggable optical modules (include ACO, DCO, and the like) in an outside plant deployment, such as the "Fiber Deep" architecture. Using the hardened optical platform 12, cable operators or the like can offer flexibility to boost fiber capacity to deliver more bandwidth and scalability between a hub 14 and headend 16 locations, and an optical access network 18 right to the network edge. Specifically, the optical access network 18 can connect directly to Hybrid Fiber Coax (HFC) devices 20, or through the hardened optical platform 12 to extend the fiber bandwidth such as support 100G/200G or more in the optical access network 18. In practical implementations, networking gear is targeted at one of two environments—commercial or industrial. Commercial environments are typically controlled, while industrial environments are referred to as "temperature hardened" or outdoor. Cable operators operate in both environments, using both outdoor cabinet and pole applications.

In an embodiment, the hardened optical platform 12 can be pole/strand-mounted and it can be a network element supporting modular packet and Optical Transport Networking (OTN) switching in the network 10. Other installation examples include a wall mount, street lamp or utility pole mount, small pole or mast, cable strand, H-Frame mounting, and pedestal. For example, the hardened optical platform 12 can support 24×10G client ports (facing the HFC, for example) and 2×100G/200G line ports (facing the optical access network 18). Configurations can also include two ports of 100 G, eight ports of 25G/10G, Sync Support (no uOLT). Power supply configurations can include, e.g., single AC, dual DC, and quasi square wave AC (cable AC).

Advantageously, embodiments can conform to Ingress Protection Rating IP67, provide easy access to install trans receiver and cables, selected optical fibers can have low bending radius and strain relief, the chassis (enclosure) can provide earth ground 2-hole lug, and there is no visible LED when closed. Further specifications of embodiments include a weight less than 50 pounds and a thermal specification of −40 degrees Celsius to 65 degrees Celsius; and GR487:46 degrees Celsius plus solar load.

Figure 12:
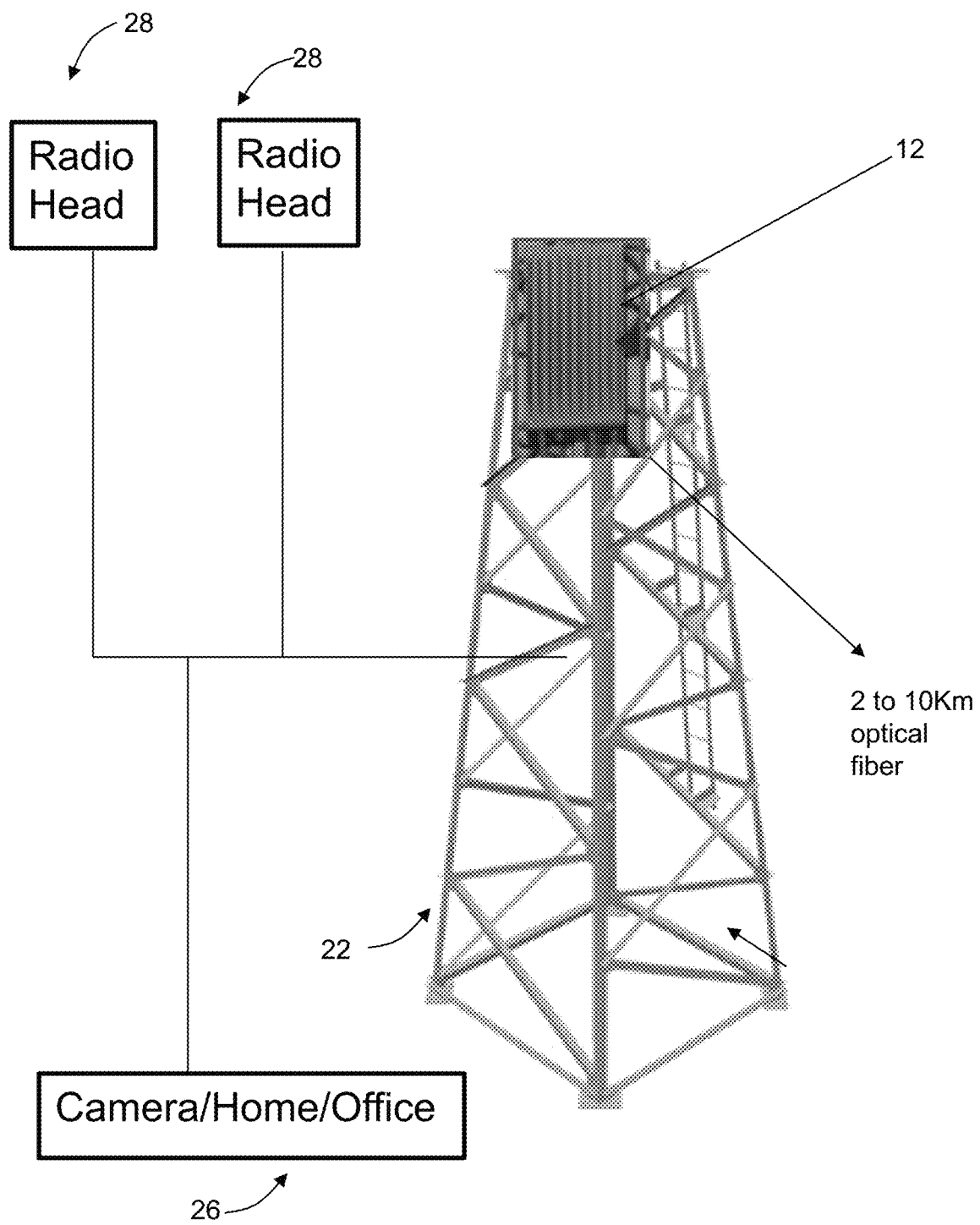
FIG. 12 is a schematic diagram showing mounting of the hardened optical platform on a tower.

FIG. 12 illustrates an example where hardened optical or telecommunications platform 12 is mounted on a communications tower 22 in an outdoor environment. In the illustrated embodiments, the platform 12 is in communication with, e.g., a camera/home/office 26 and radio head 28.

Those skilled in the art will recognize the network 10 is presented for illustration purposes as one possible application for the platform 12 described herein. Other embodiments are also contemplated. Thus, while "fiber deep" applications are contemplated, other outside plant applications including cellular/wireless, etc., are contemplated, as well.

Thus, an objective of the hardened optical or telecommunications platform 12 is to provide a hardened platform that can support, e.g., pluggable optical modules including coherent optics such as ACO, DCO, etc. such that these pluggable optical modules, as well as PCBs and other electronic and associated components, etc., can be deployed outside of controlled environments.

Hardened Optical or Telecommunications Platform

Figure 13:
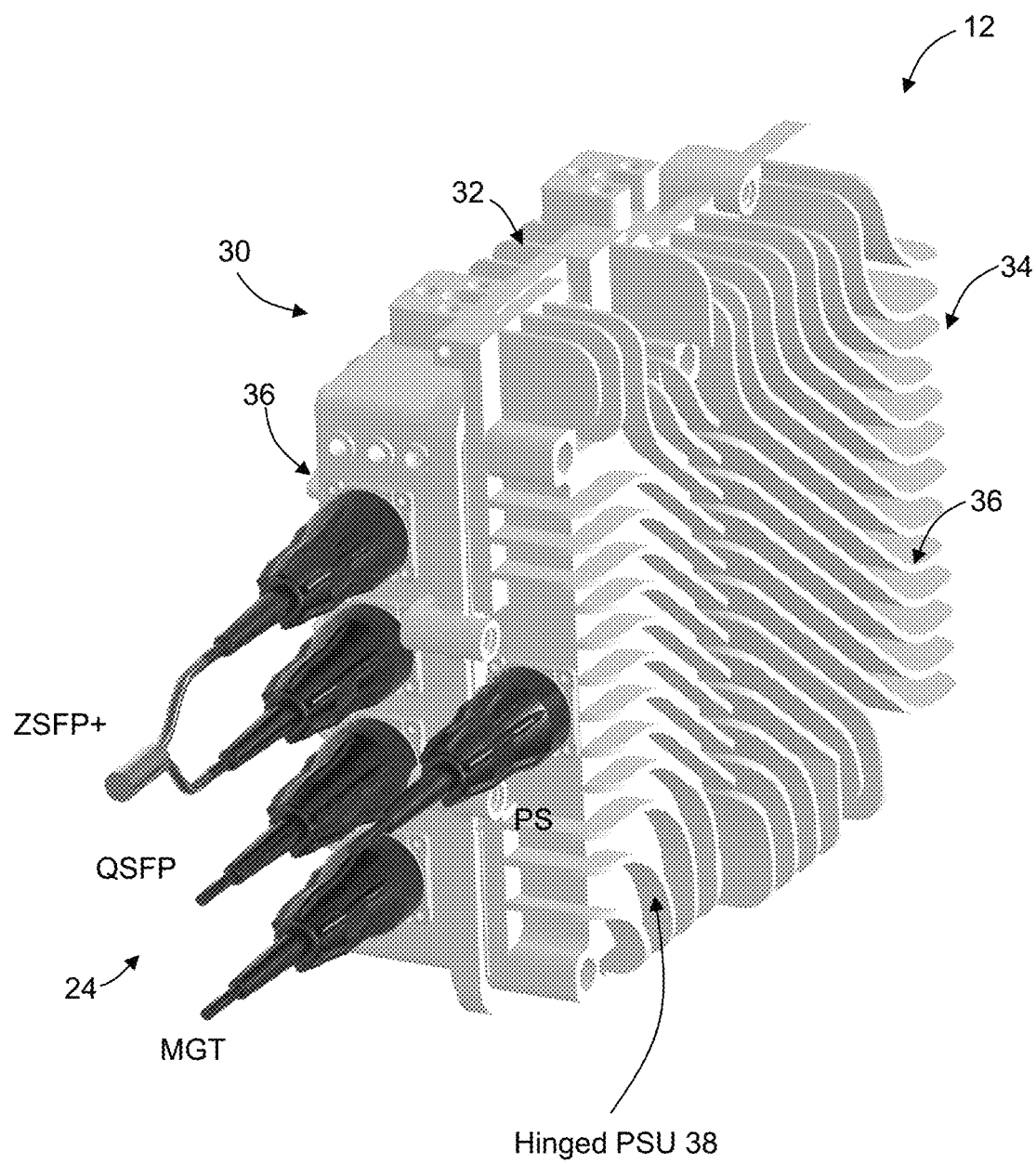
FIG. 13 is a perspective diagram of an enclosure ("clamshell") in a configuration for horizontal mounting.
Figure 14:
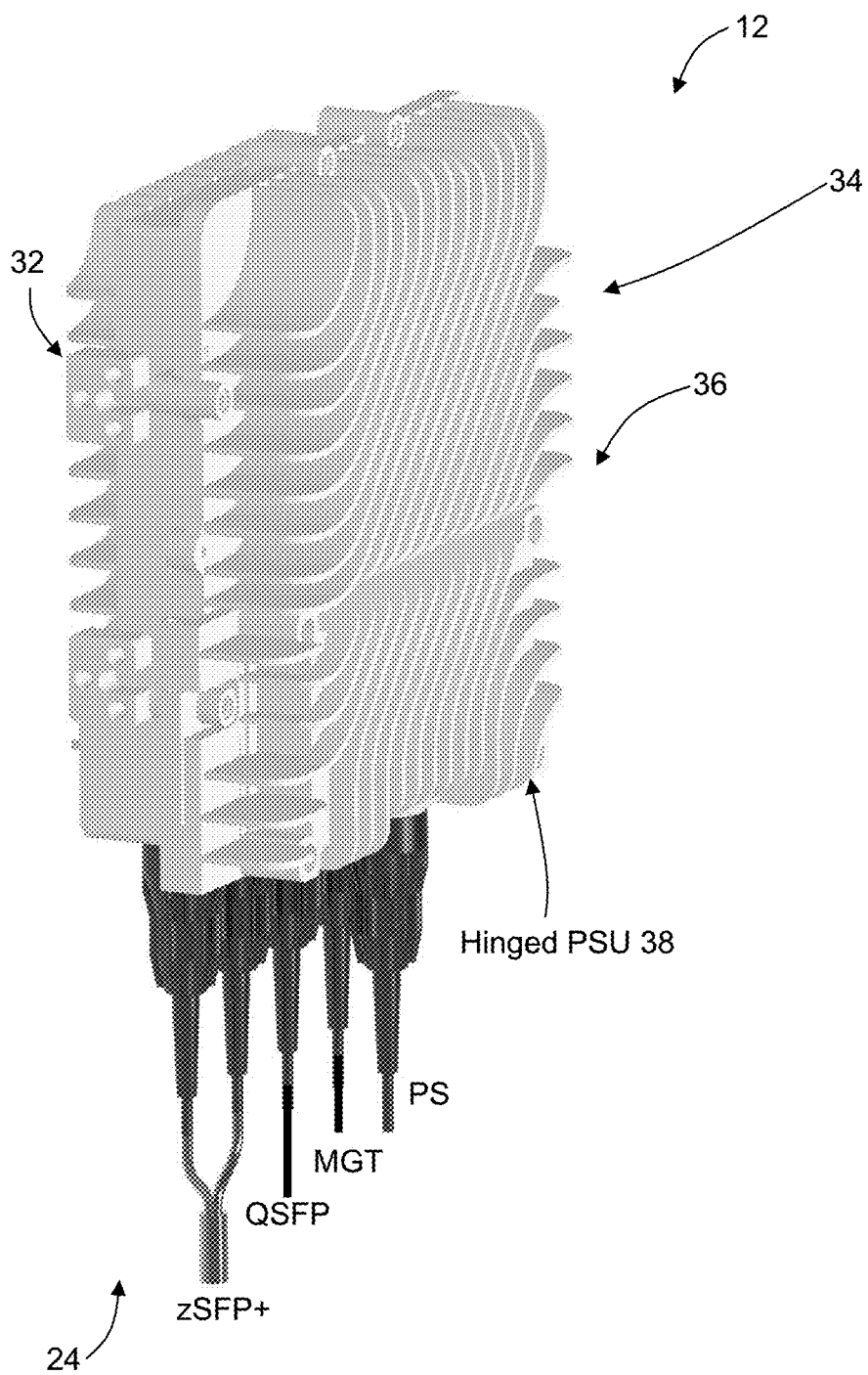
FIG. 14 is a perspective diagram of an enclosure ("clamshell") in a configuration for vertical mounting.

FIGS. 13-23 illustrate some details and features of the hardened optical or telecommunications platform 12 in various embodiments. Specifically, FIG. 13-14 are perspective diagrams of an enclosure 30 of the hardened optical or telecommunications platform 12 with pluggable optics connections 24 and supporting internal fiber organization further described below. The enclosure 30 comprises a base (first or lower) half 32 and a top cover (or second) half 34 and may also be referred to as a "clamshell." The outer portions of the base half 32 and the top cover half 34 have angular fins 36 that assist mounting of the unit horizontally and vertically, as well as assist in dissipating heat out to the environment from inside the enclosure 30, as further explained below. More particularly, FIG. 13 depicts a horizontal configuration for wire strand mounting and FIG. 14 depicts a vertical configuration for pole mounting. FIGS. 13-14 further depict a hinged power supply unit (PSU) 38 over the top cover half 34. Advantageously, no hinge is required between the base half 32 and the top cover half 34 thereby providing a simplified design. The base half 32 and the top cover half 34 can be mounted using screws or other fasteners, and an O-ring may also be employed to provide IP67 ingress protection. I/O plugs of the pluggable optic connections 24 can also provide EMI and IP67 ingress protection.

Figure 15:
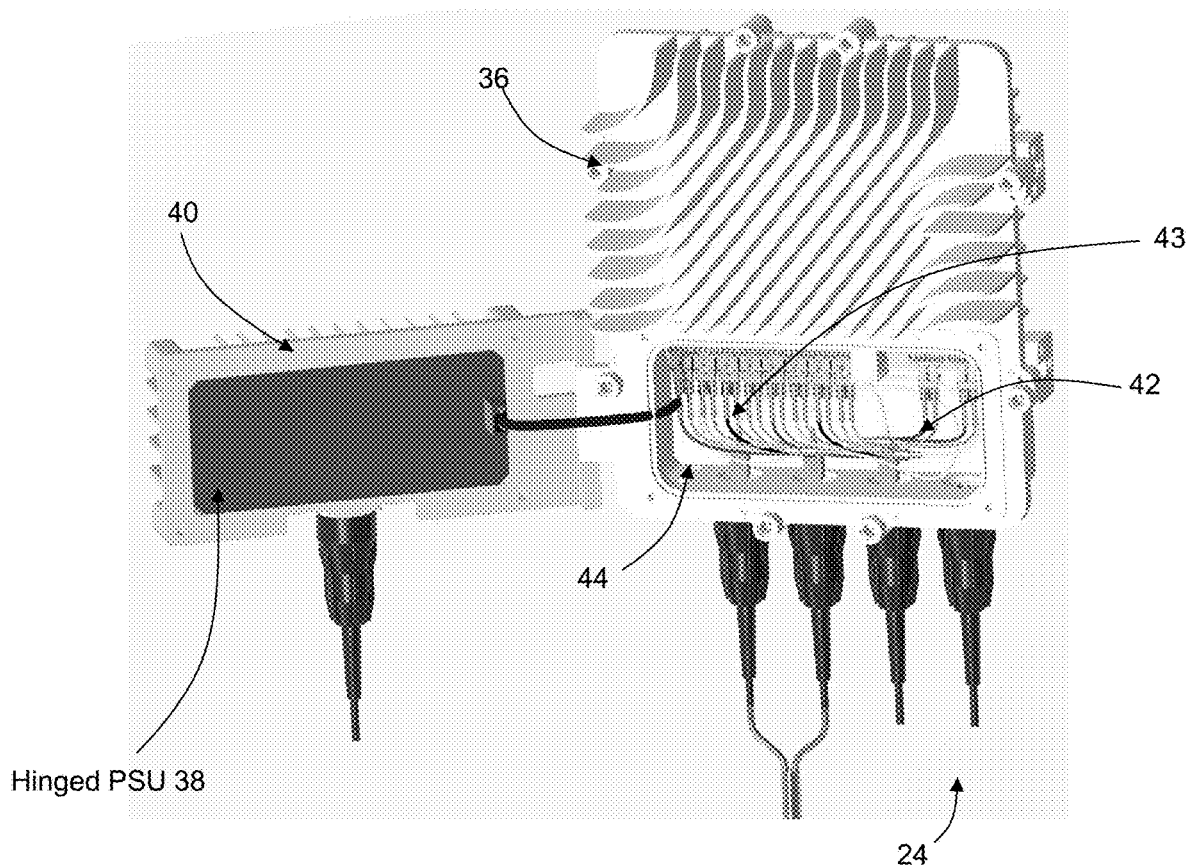
FIG. 15 is a perspective diagram of FIG. 14 with door of the hinged PSU open thereby exposing the internal fiber organization.
Figure 16:
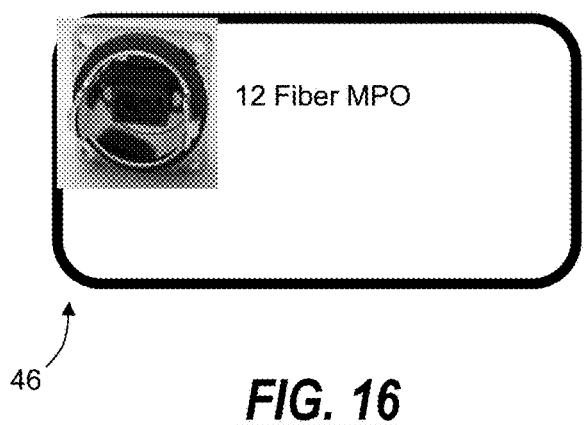
FIG. 16 is a close up diagram depicting internal connection features of pluggable optics.
Figure 17:
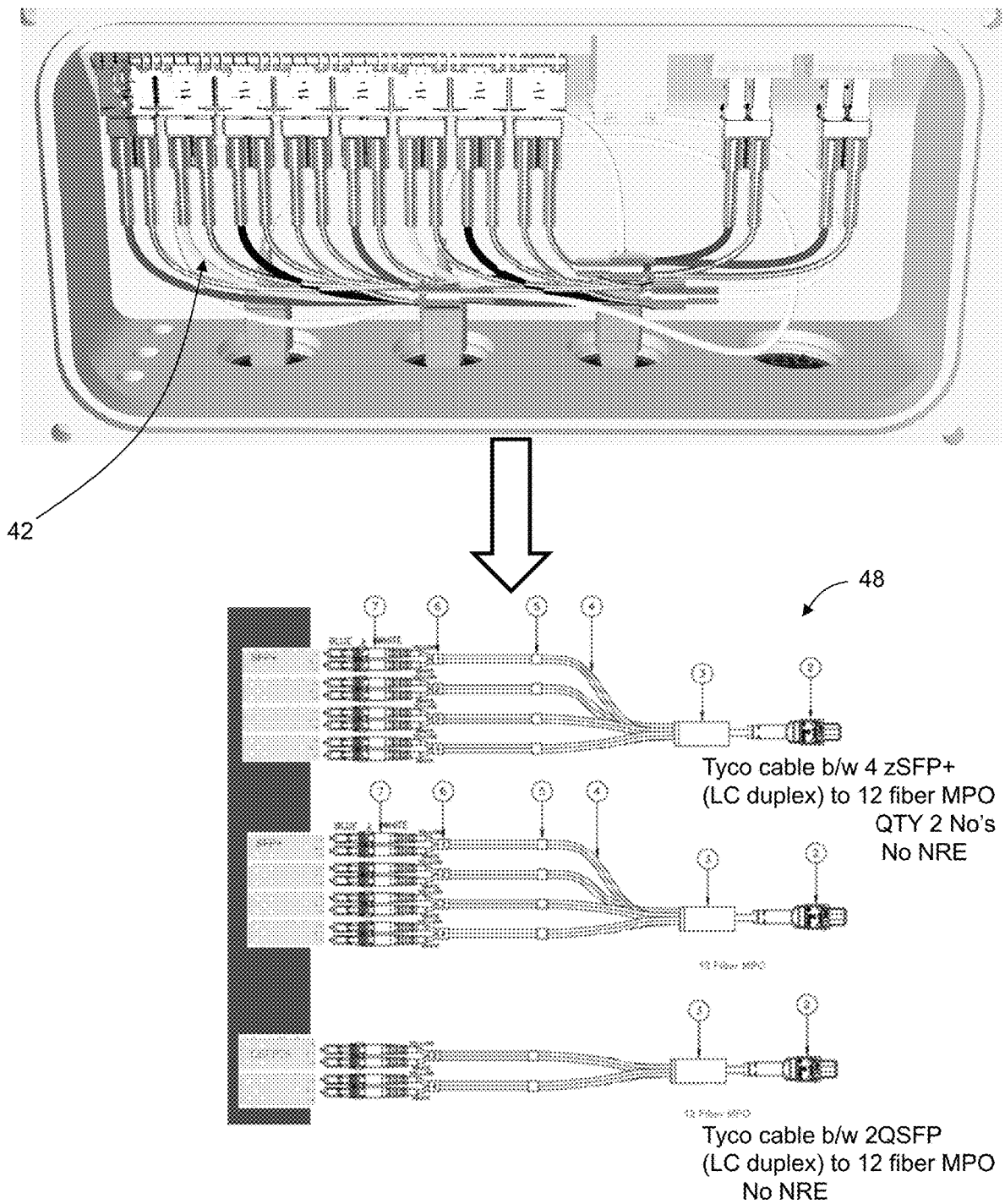
FIG. 17 is a schematic diagram depicts the internal fiber organization and associated cabling.
Figure 18:
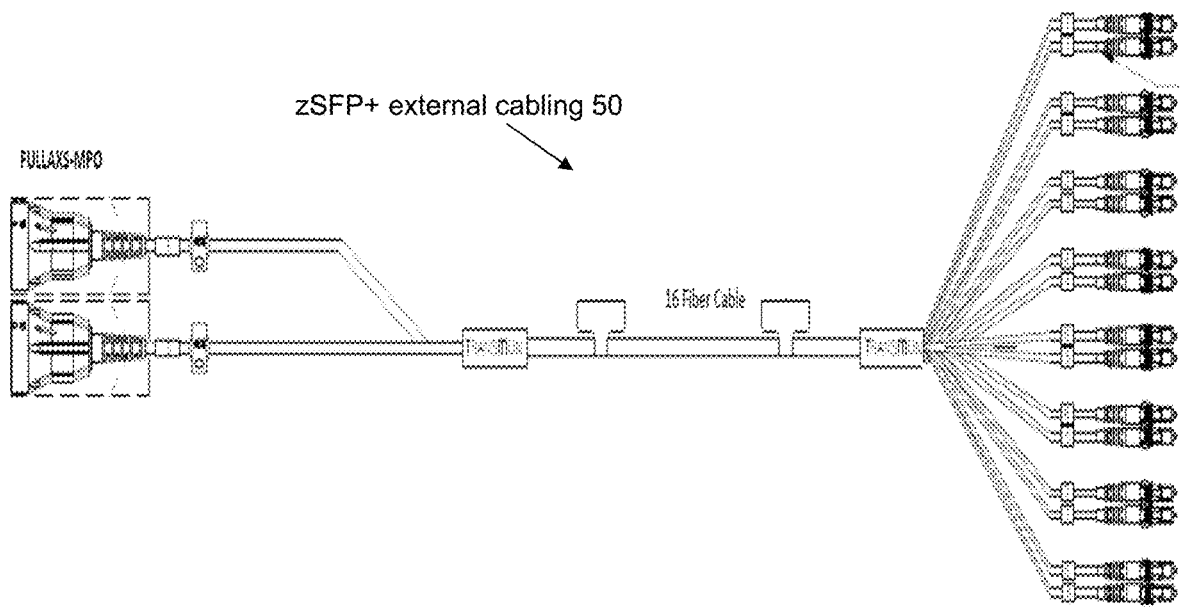
FIG. 18 is a schematic diagram depicting external cabling for the vertical mounting configuration of FIG. 14.
Figure 19:
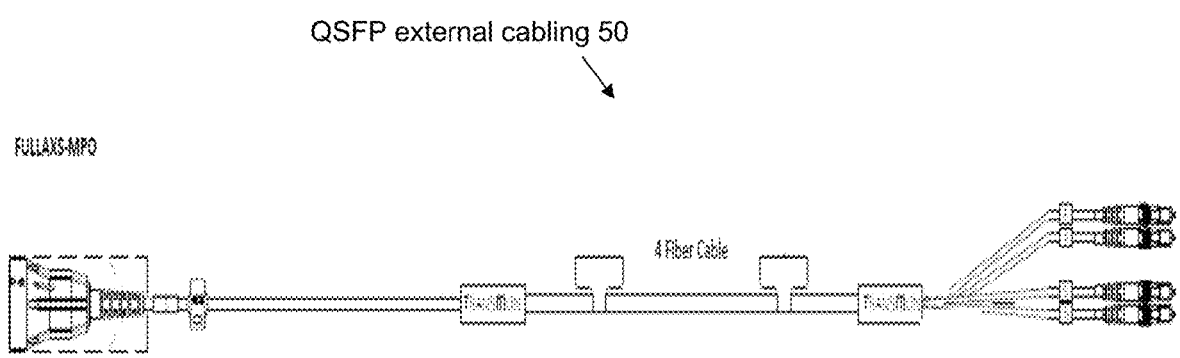
FIG. 19 is a schematic diagram depicting further external cabling for the vertical mounting configuration of FIG. 14.
Figure 20:
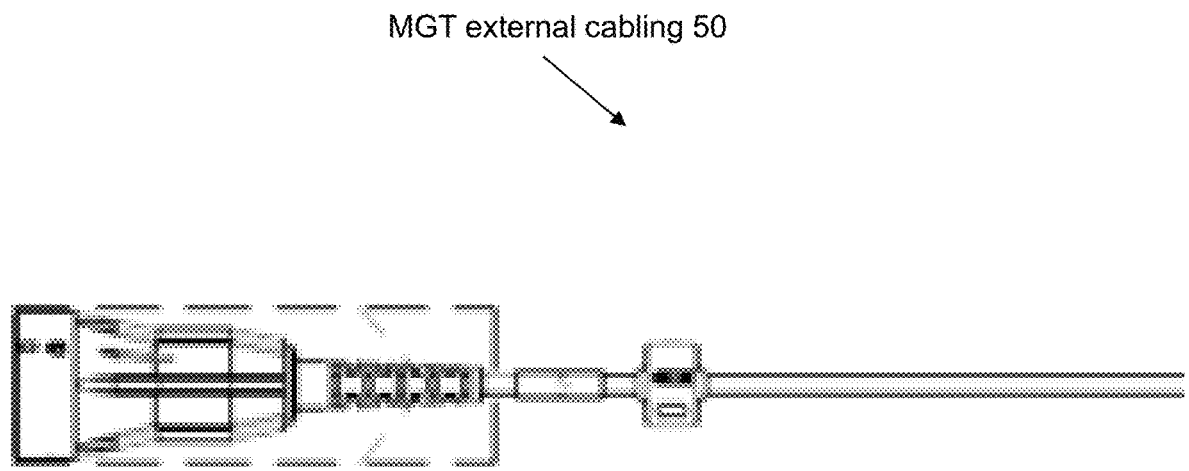
FIG. 20 is a schematic diagram depicting additional external cabling for the vertical mounting configuration of FIG. 14.
Figure 21:
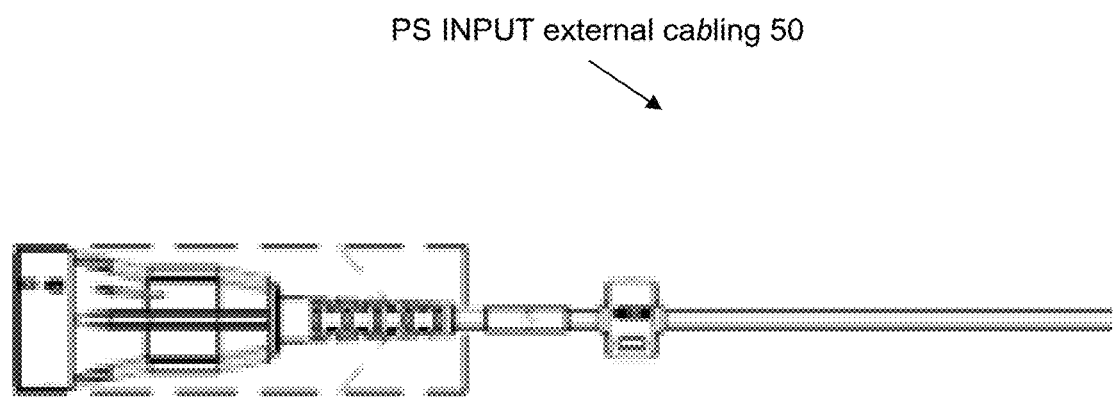
FIG. 21 is a schematic diagram depicting further additional external cabling for the vertical mounting configuration of FIG. 14.

FIG. 15 is a perspective diagram of FIG. 14 with door 40 of the hinged PSU 38 open thereby exposing the internal fiber organization 42 including pluggable optics 43. Advantageously, a hinged power supply with live input is provided. A service window 44 is also depicted therein to facilitate installation or change of a trans receiver. FIG. 16 is a close up diagram depicting pluggable optics internal connection features 46, specifically 12 fiber MPO. FIG. 17 further depicts the internal fiber organization 42 and associated cabling 48. FIGS. 18 and 19 depict external cabling 50 for the vertical mounting configuration of FIG. 14. Specifically, FIG. 18 depicts zSFP+ external cabling and FIG. 19 depicts QSFP external cabling. Similarly, FIGS. 20 and 21 depict additional external cabling 50 for the vertical mounting configuration of FIG. 14. In particular, FIG. 20 depicts MGT external cabling and FIG. 21 depicts PS INPUT external cabling. It is noted that the cabling 50 depicted in FIGS. 18-21 could also be employed with the horizontal mounting configuration of FIG. 13.

In an embodiment, the hardened optical or telecommunications platform 12 can have a rectangular shape, however, other shapes are contemplated. Example dimensions can includes 8.5 inches×4.5 inches×11.8 inches (W×H×L), and other dimensions are contemplated.

Advantages of the embodiments of FIGS. 13-21 (e.g., concept 1 with internal fiber organization 42) described above include a lower number I/O, with all on the same side according to embodiments, e.g., two I/O for SFP, one I/O for QSFP, one for management, and one for power supply. Advantageously, no hinge is required on base 32 and top cover 34. Moreover, ease of replacing and/or adding a transceiver by opening the door 40 is facilitated by the design. A further advantage, which is described in detail below with respect to the thermal management aspect of embodiments of the invention, is that a customized heat sink can spread heat to the entire chassis thereby optimizing thermals.

Figure 22:
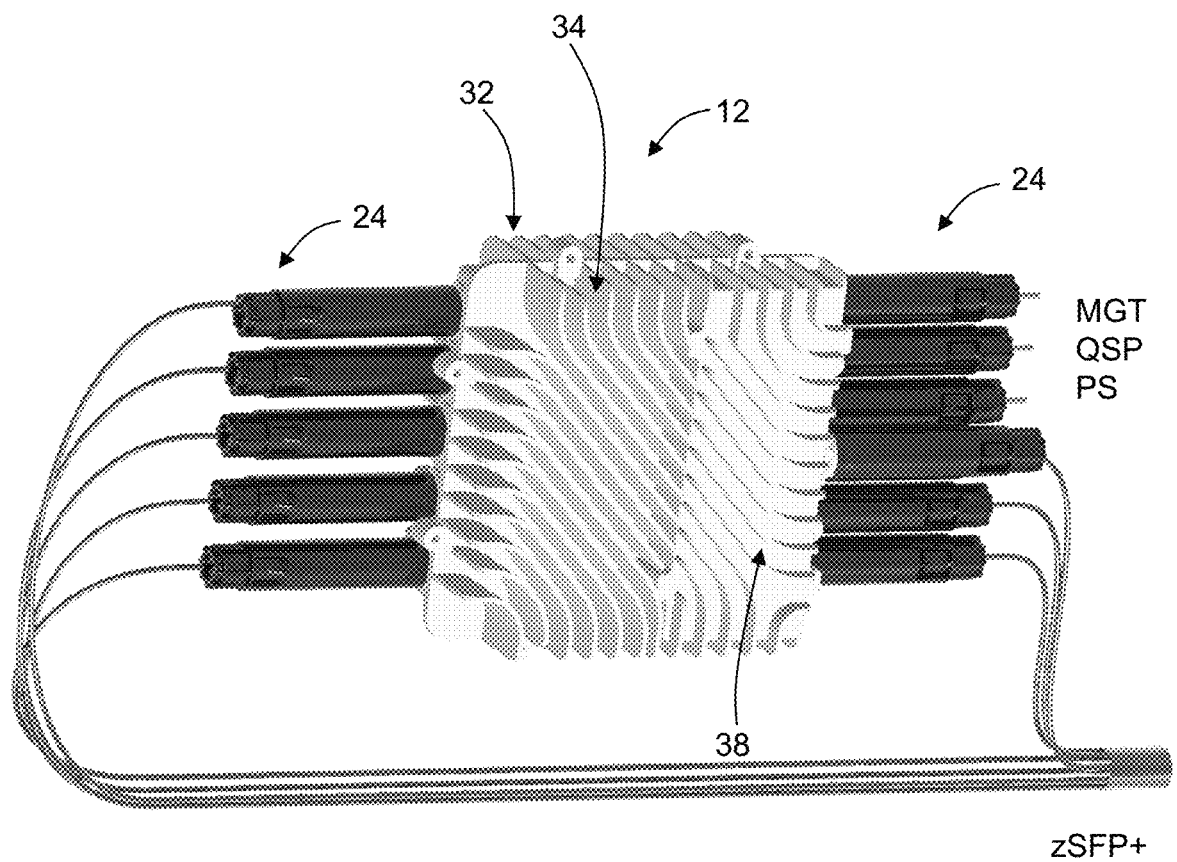
FIG. 22 is a perspective diagram of an enclosure ("clamshell") in a configuration for horizontal mounting.
Figure 23:
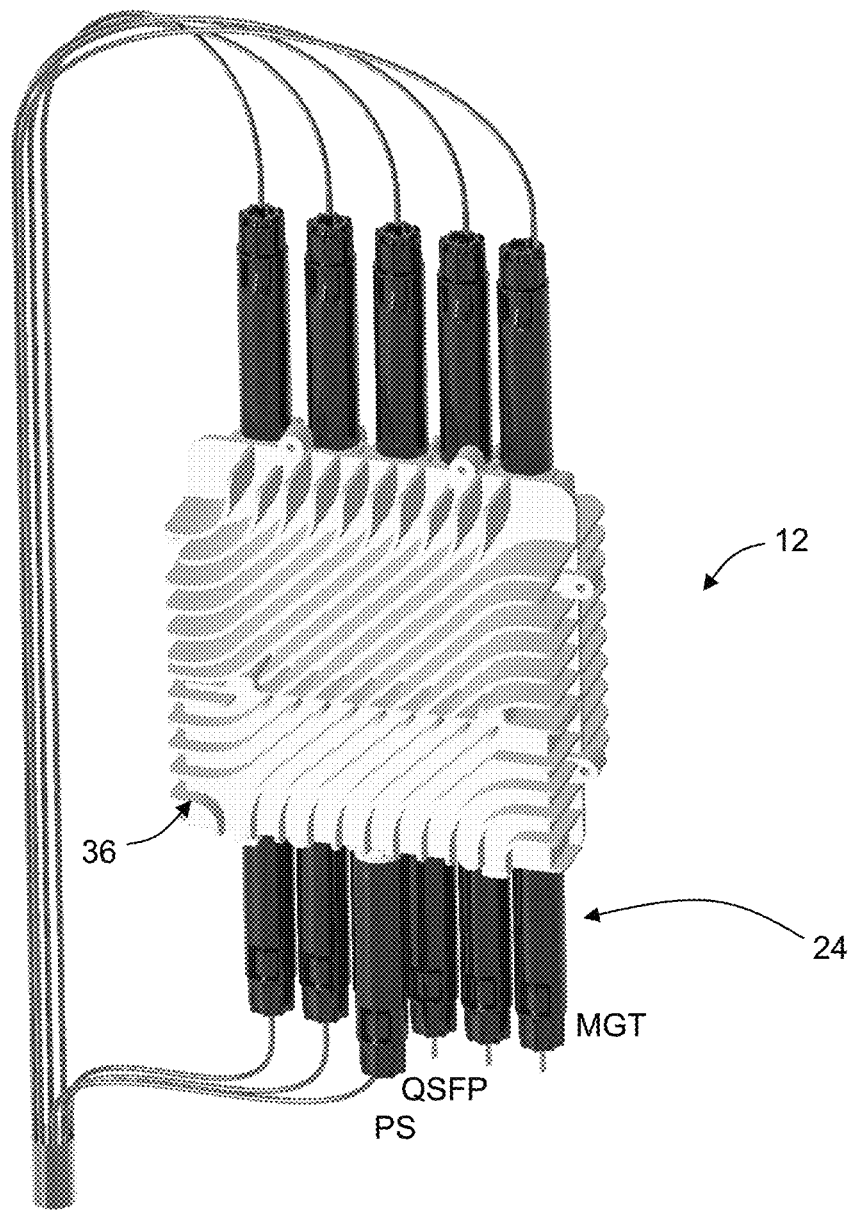
FIG. 23 is a perspective diagram of an enclosure ("clamshell") for vertical mounting.

Referring now to FIGS. 22-23, these figures depict further embodiments of the hardened, optical or telecommunications platform 12 (e.g., concept 2 without fiber organization). Thus, no internal extra space is required therein for internal fibers, etc. Specifically, FIG. 22 depicts a horizontal configuration for wire strand mounting and FIG. 23 depicts a vertical configuration for pole mounting, both offering two-sided external cable management. The base half 32 and the top cover half 34 also have angular fins 36 on the outer portions thereof that assist in mounting of the unit horizontally and vertically, as well as assist in dissipating heat out to the environment from both halves of the enclosure. FIGS. 22-23 further depict a hinged PSU 38 over the top cover half 34. In an embodiment, the hardened optical or telecommunications platform 12 can thus have a rectangular shape, however, other shapes are contemplated. Example dimensions can includes 9.3 inches×9.3 inches×5 inches (H×L×W), and other dimensions are contemplated.

Advantageously, as also in the case of FIGS. 13-14, no hinge is required between the base half 32 and the top cover half 34 thereby providing a simplified design. The base half 32 and the top cover half 34 can be mounted using screws or other fasteners, and an O-ring may also be employed to provide IP67 ingress protection. I/O plugs of the pluggable optic connections 24 can also provide EMI and IP67 ingress protection and, advantageously, all ports thereof can be accessible for installation and replacement externally.

The hardened optical or telecommunications platform 12 includes the enclosure 30 ("clamshell") comprising base half 32 and top cover half 34 with door 32, and can be any hardened material, i.e., which is environmentally sealed to water, wind, etc. Thus, by "hardened" enclosure or platform it is herein referred to being sealed to the environment and thus without vents, airholes, etc. Specifically, the hardened optical platform 12, via the enclosure 30 and the door 32, is weatherproof. The enclosure 30 can include fiber and power access ports enabling cables to be routed into the interior. The enclosure 30 can also include fins 36, as noted above, to move heat generated in the interior to the environment via convection. Similarly, the optic connections 24 are of a suitable material, such as plastic, to create a weatherproof seal. Again, there is no airflow between the interior and the environment as there is, e.g., not a single vent for air to flow to outside, according to embodiments.

In an embodiment, the hardened optical or telecommunications platform 12 can be mounted on a pole or the like, as explained above. In another embodiment, the hardened optical platform 12 can be placed on a pedestal or some other outdoor location, such as street level cabinets. In a further embodiment, the hardened optical platform 12 can be mounted on a building exterior or the like.

Thermal Management in the Optical or Telecommunications Platform

Figure 2:
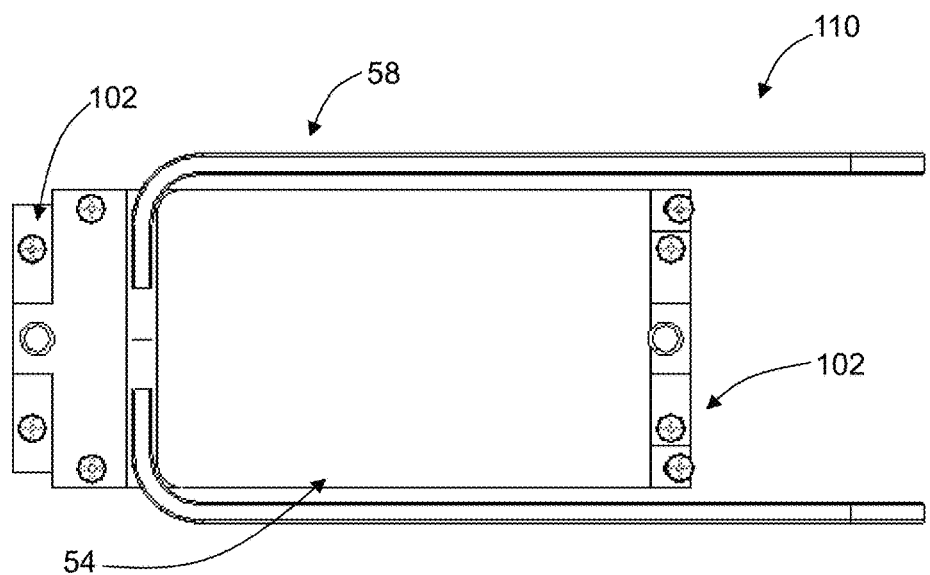
FIG. 2 is a top view diagram of a thermal control system depicting a heat sink assembly without PCB and enclosure ("clamshell")
Figure 3:
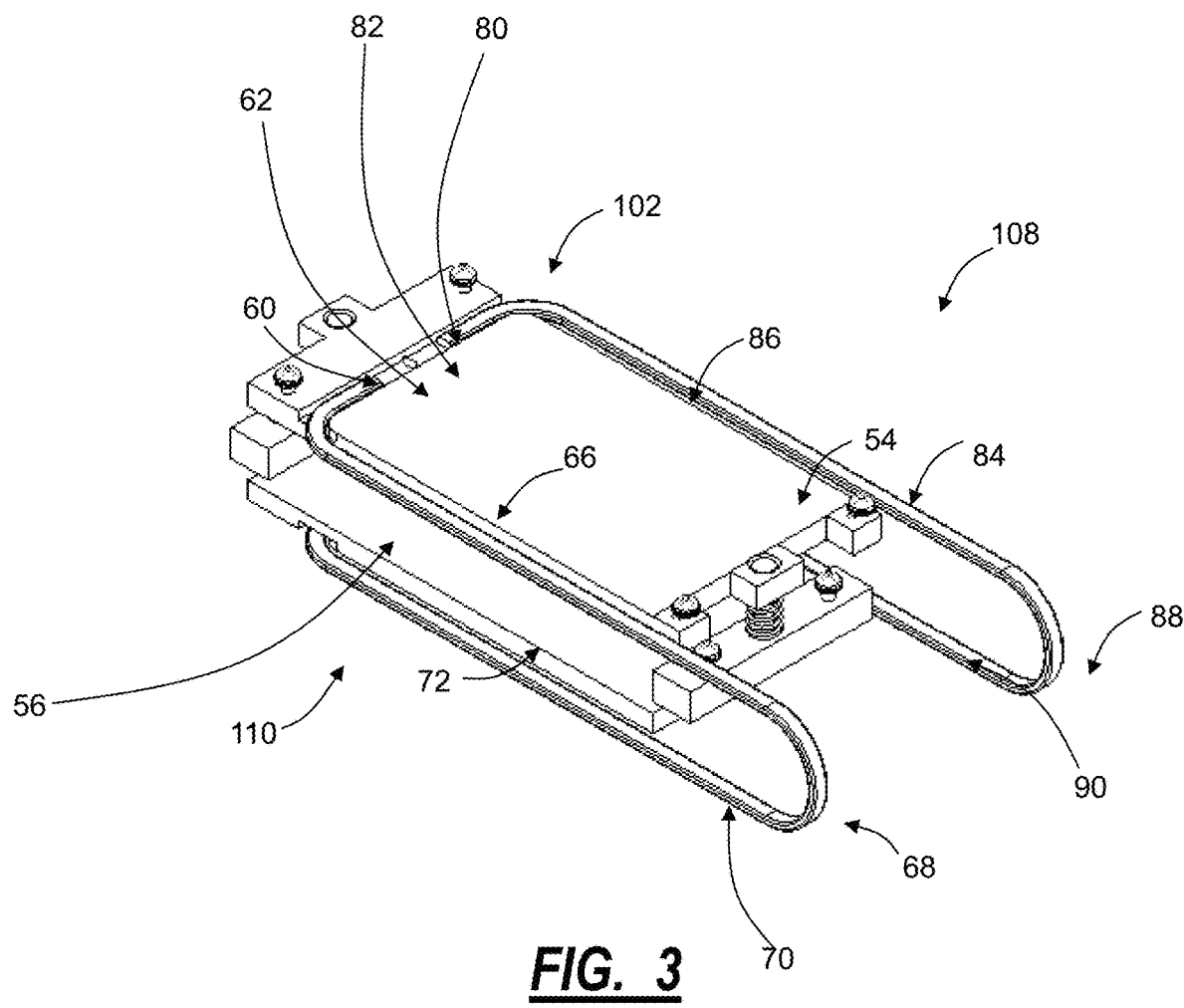
FIG. 3 is a perspective diagram of FIG. 2.
Figure 4:
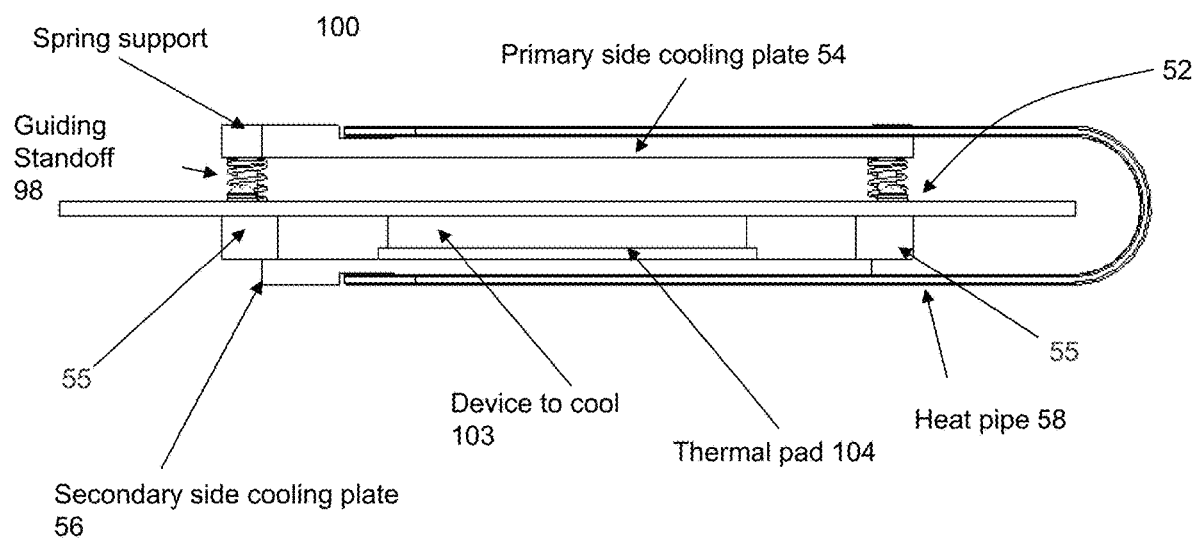
FIG. 4 is a side view of a thermal control system with heat sink assembly assembled to PCB over device with a thermal pad.
Figure 5:
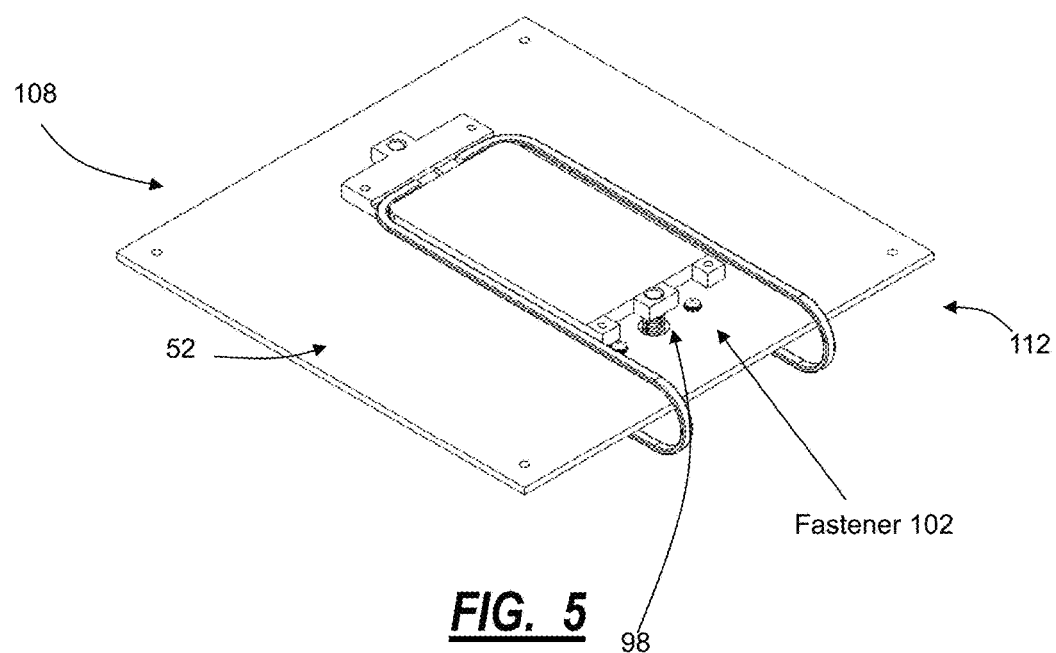
FIG. 5 is a perspective diagram of the top view of FIG. 4 showing fasteners through the PCB.
Figure 6:
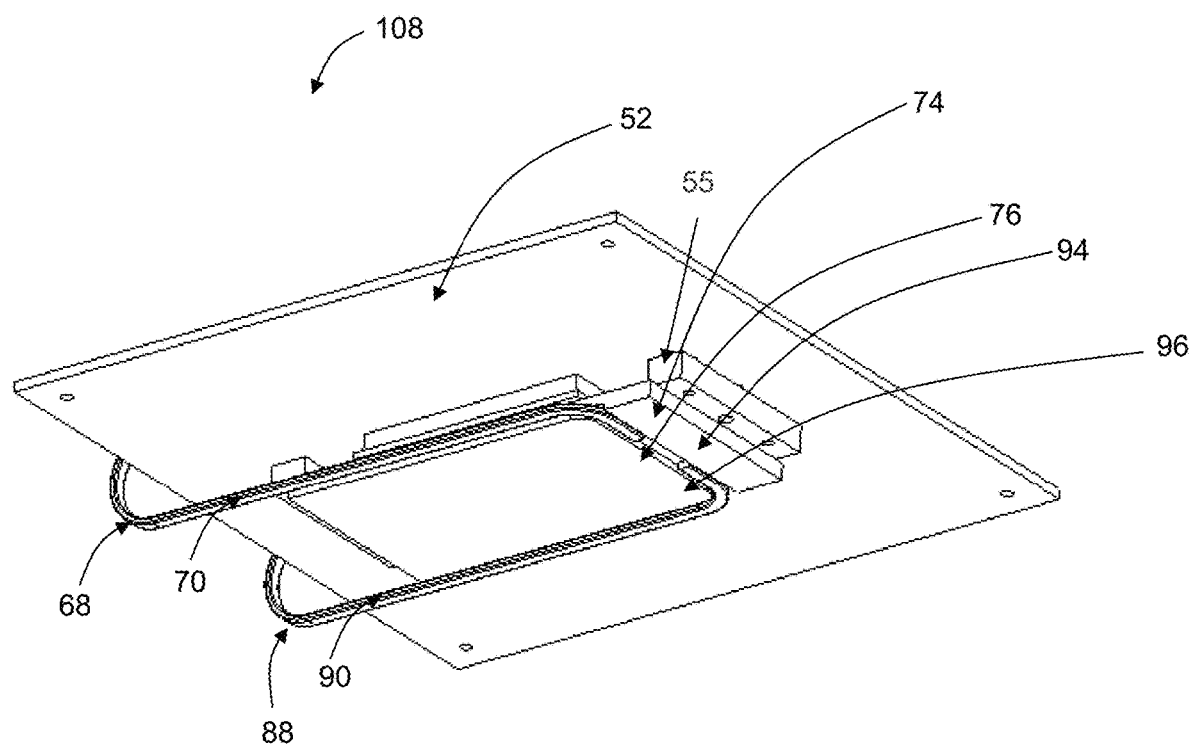
FIG. 6 is perspective view diagram of the bottom view of FIG. 5.
Figure 7:
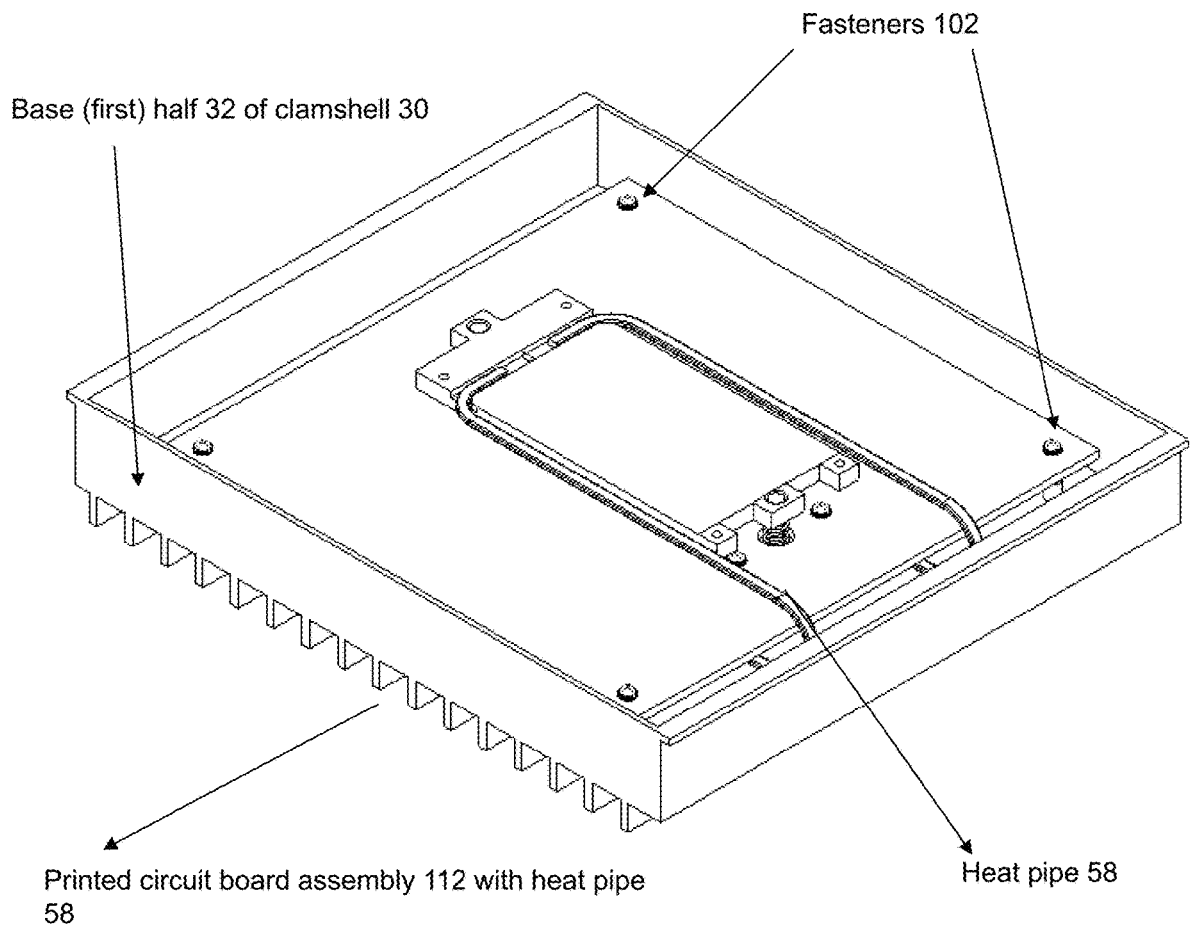
FIG. 7 is a perspective view diagram showing FIG. 5 assembled to the lower side of the enclosure ("clamshell") with fasteners.
Figure 8:
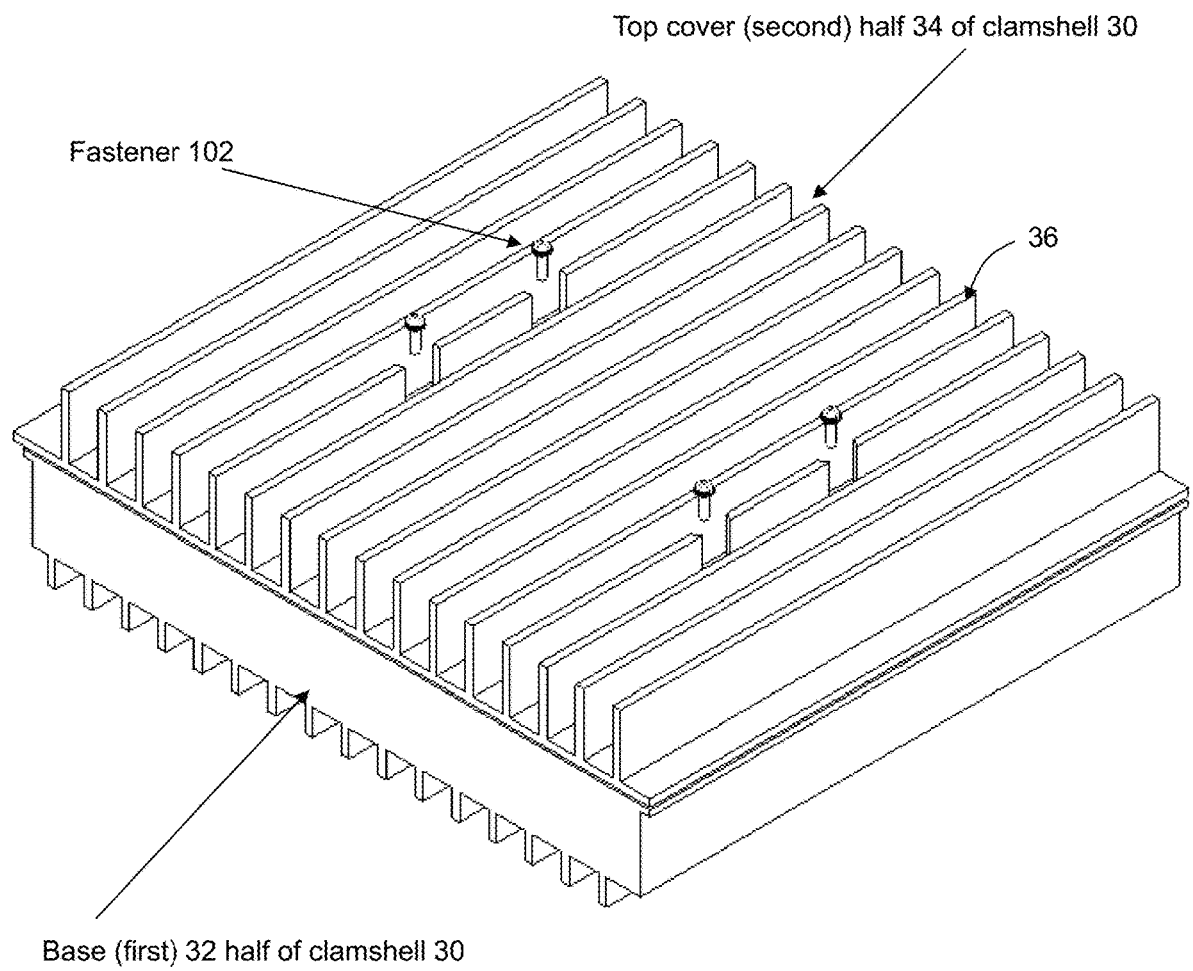
FIG. 8 is a perspective view diagram of FIG. 7 with the top cover half of the enclosure ("clamshell") assembled thereon.
Figure 9:
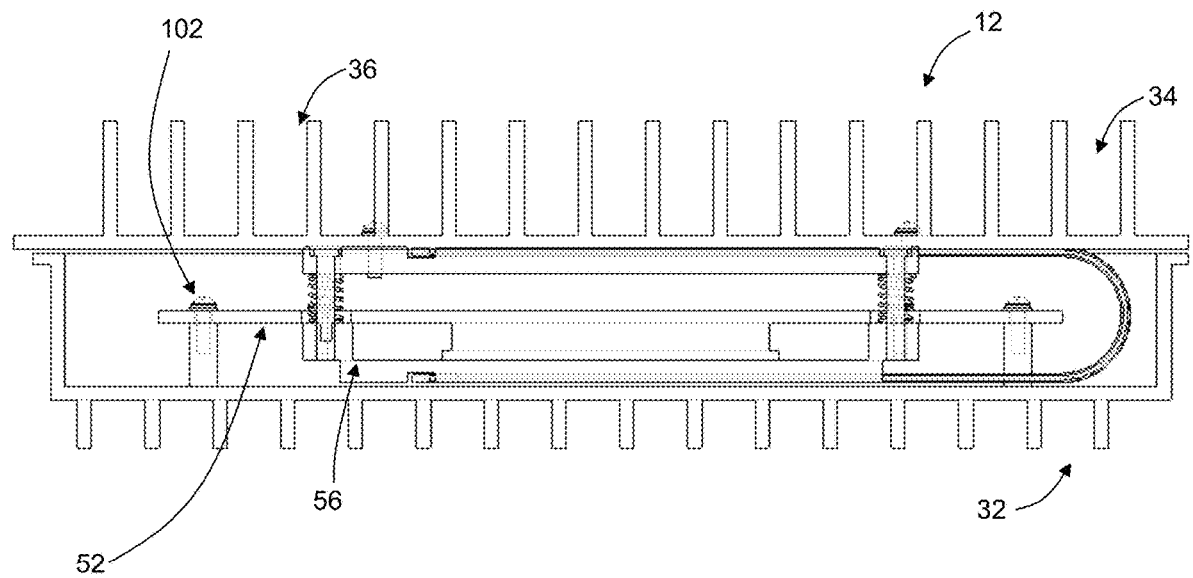
FIG. 9 is a cross-sectional diagram of FIG. 8 with top cover half and base half of enclosure ("clamshell")
Figure 10:
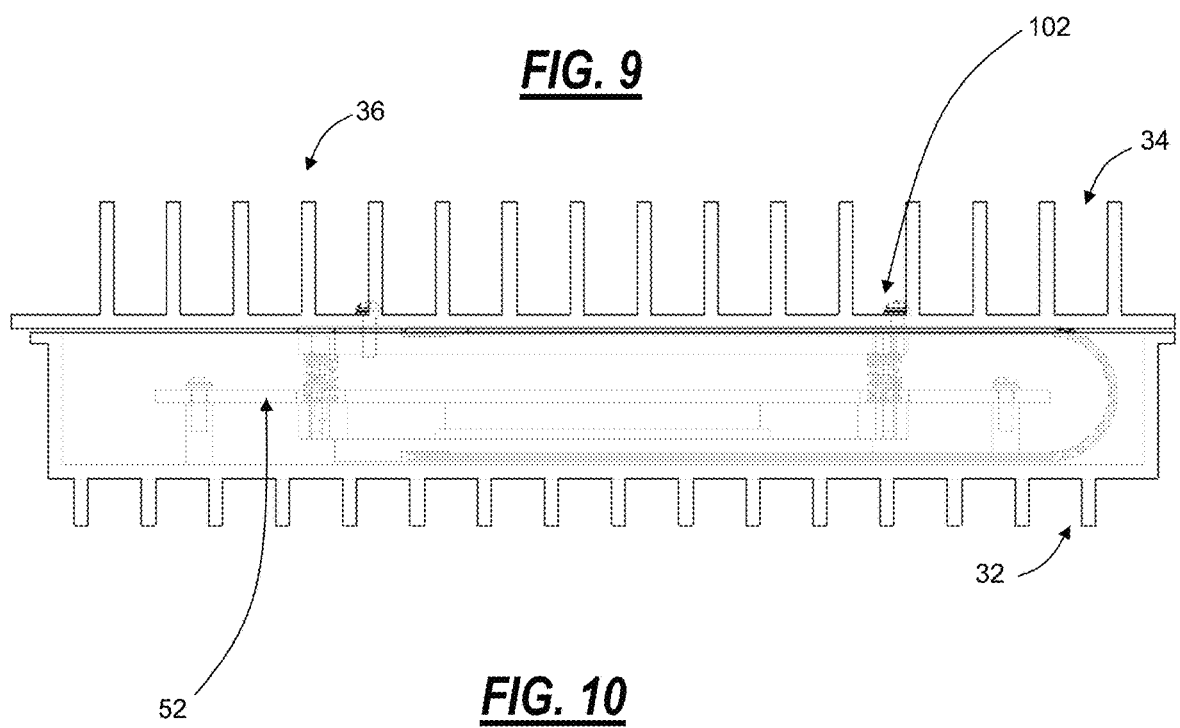
FIG. 10 is a cross-sectional diagram (hidden line view) of FIG. 8 with top cover half and base half of enclosure ("clamshell")
Figure 11:
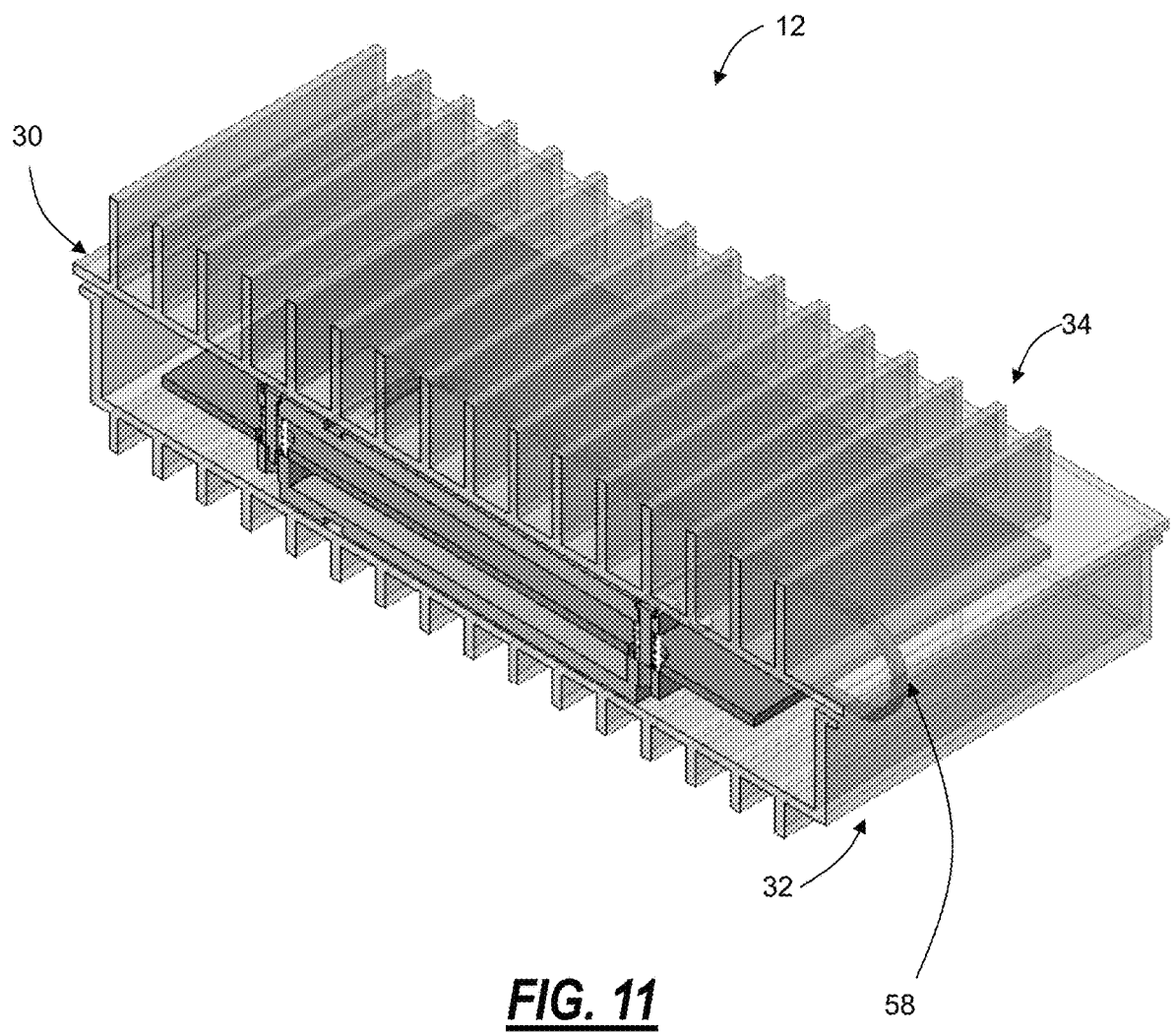
FIG. 11 is a perspective view of a optical platform with top cover half and base half of enclosure ("clamshell") including heat distributing mechanism therein.

FIGS. 2-11 and 24-27 illustrate details and features of the thermal management in the optical or telecommunications platform 12, according to embodiments. Specifically, FIG. 2 is a top view diagram of a thermal control system 108 depicting a heat sink assembly 110 without PCB 52 and enclosure ("clamshell") 30. FIG. 3 is a perspective diagram of FIG. 2. FIG. 4 is a side view of a thermal control system 108 with heat sink assembly 110 assembled to the PCB 52 over device 103 with a thermal pad 104. FIG. 5 is a perspective diagram of the top view of FIG. 4 showing fasteners 102 through the PCB 52. FIG. 6 is perspective view diagram of the bottom view of FIG. 5. FIG. 7 is a perspective view diagram showing FIG. 5 assembled to the lower side of the enclosure ("clamshell") 30 with fasteners 102. FIG. 8 is a perspective view diagram of FIG. 7 with the top cover half 34 of the enclosure ("clamshell") 30 assembled thereon. FIG. 9 is a cross-sectional diagram of FIG. 8 with top cover half 34 and base half 32 of the enclosure ("clamshell") 30. FIG. 10 is a cross-sectional diagram (hidden line view) of FIG. 8 with top cover half 34 and base half 32 of the enclosure ("clamshell") 30. FIG. 11 is a perspective view of an optical or telecommunications platform 12 with top cover half 34 and base half 32 of the enclosure ("clamshell") 30 including heat distributing mechanism 58 therein.

Figure 24:
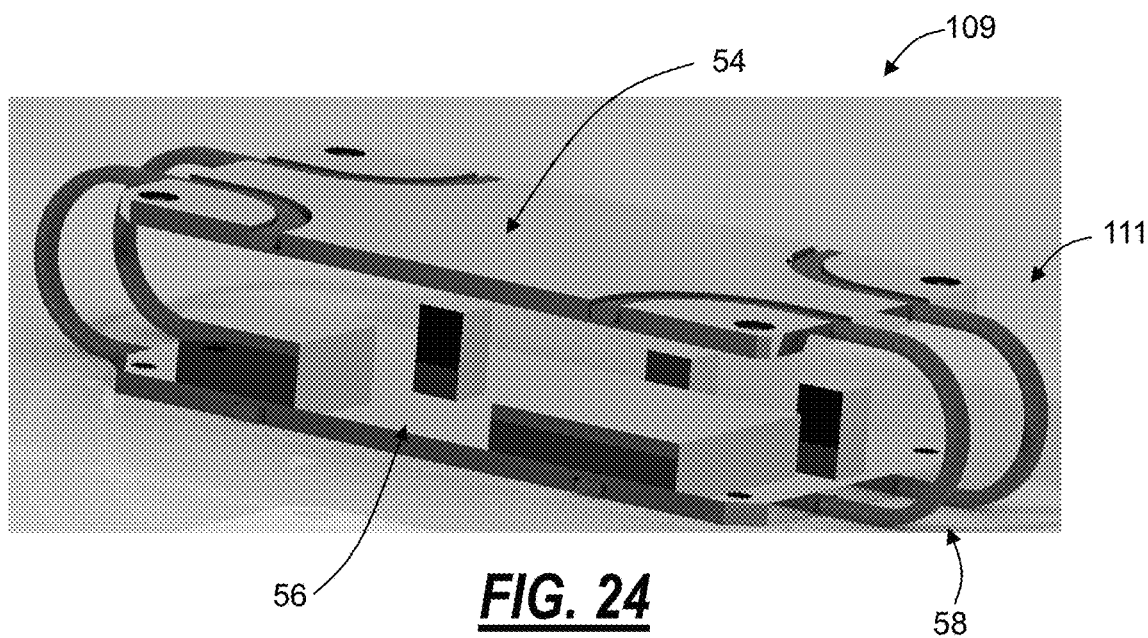
FIG. 24 is a perspective diagram of a thermal control system depicting a heat sink assembly without PCB and clamshell, according to another embodiment.
Figure 25:
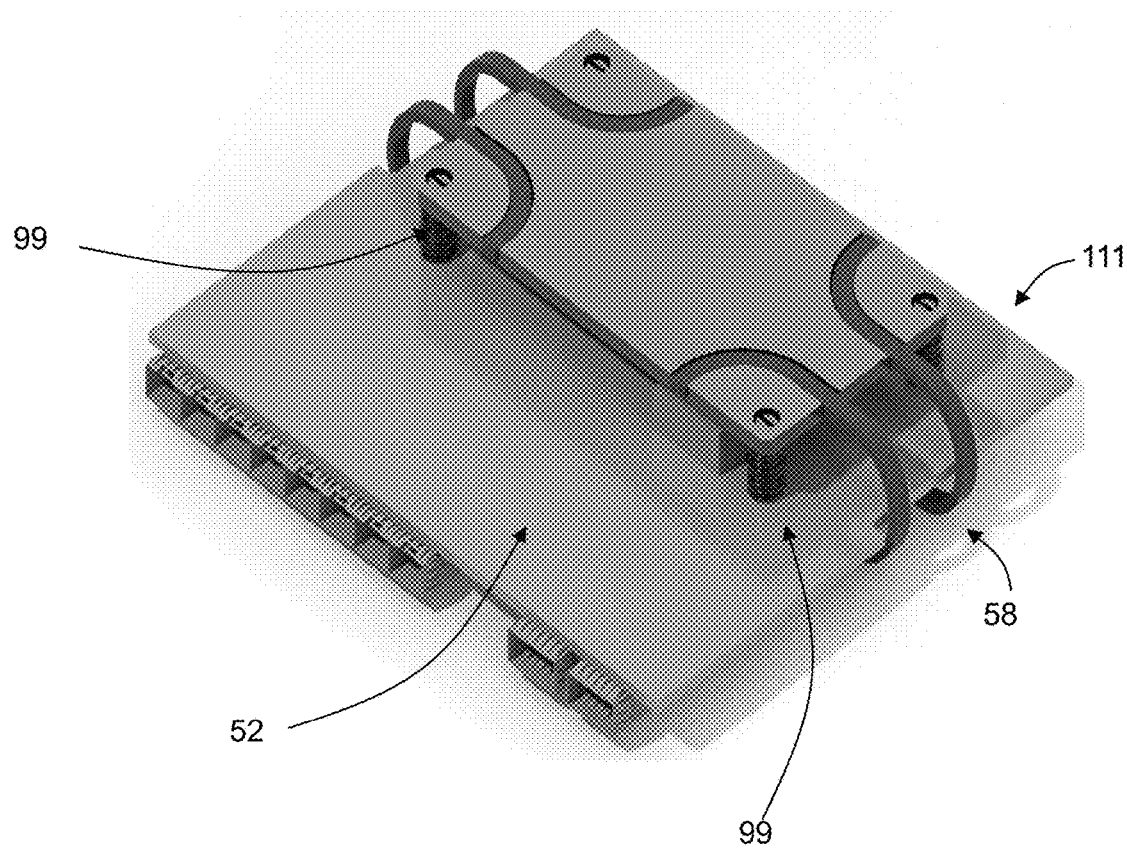
FIG. 25 is a perspective diagram of the top view of FIG. 24 with the heat sink assembly assembled to a PCB.
Figure 26:
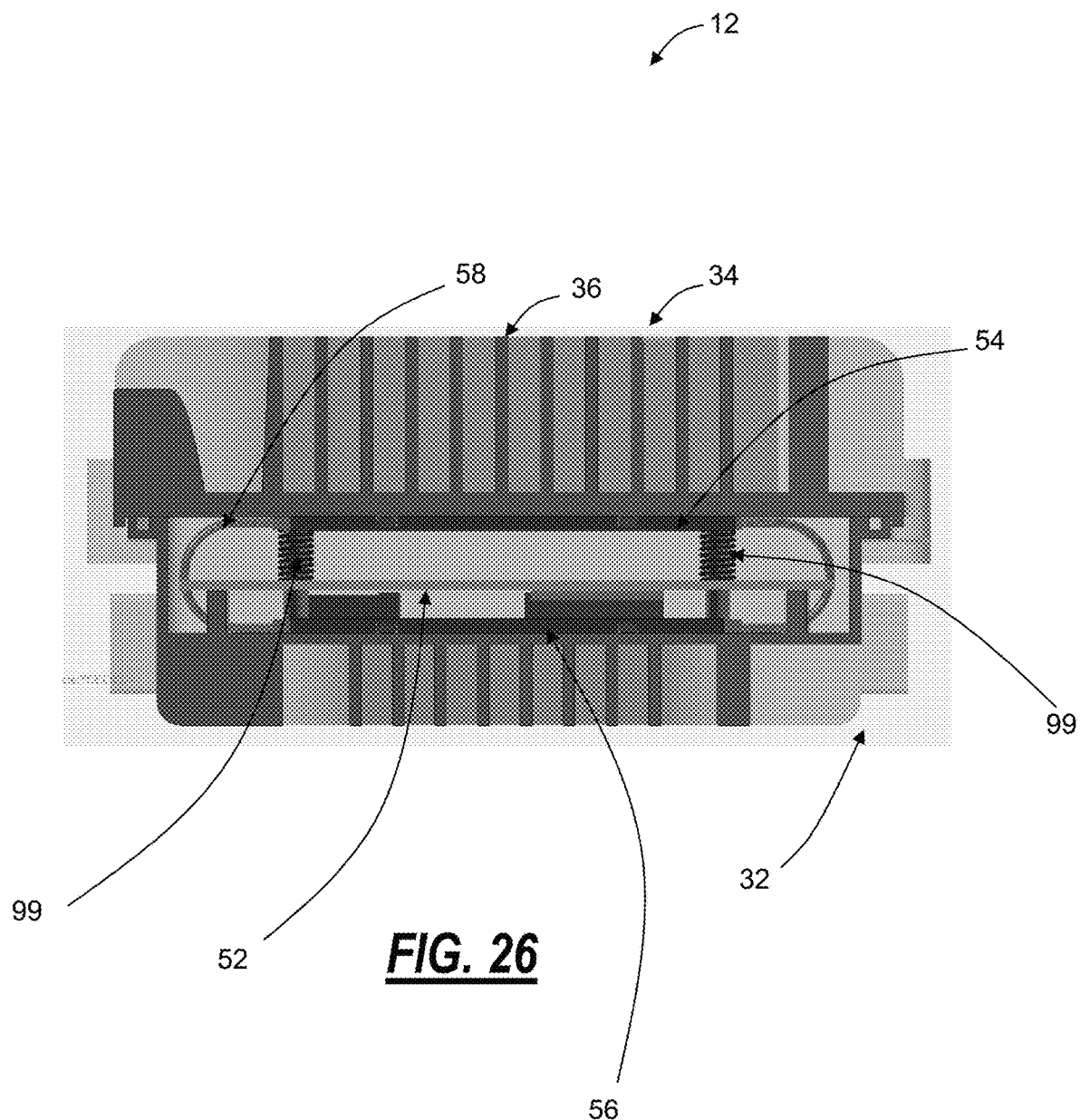
FIG. 26 is a side view of the embodiment of FIG. 25 and depicting an optical or telecommunications platform with heat sink assembly assembled to a PCB with an enclosure ("clamshell").

FIG. 24 is a perspective diagram of a thermal control system 109 depicting a heat sink assembly 111 without PCB 52 and enclosure ("clamshell") 30, according to another embodiment. FIG. 25 is a perspective diagram of the top view of FIG. 24 with the heat sink assembly 111 assembled to a PCB 52; and FIG. 26 is a side view of the embodiment of FIG. 25 and depicting an optical or telecommunications platform 12 with heat sink assembly 111 assembled to a PCB 52 with an enclosure ("clamshell") 30. Lastly, FIG. 27 is a flow diagram of a process of distributing heat substantially evenly between a base half 32 and a top cover half 34 of an outdoor, hardened telecommunications clamshell platform 12.

Thus, according to embodiments and with particular reference to FIGS. 8-11 for ease of reference, an outdoor, hardened telecommunications clamshell platform 12 comprises a base half 32 and a top cover half 34, each half having outer fins 36 thereon. A Printed Circuit Board (PCB) 52 is disposed between two cooling plates 54, 56 within the platform 12; and a heat distributing mechanism 58 surrounds the PCB 52 within the platform 12 and is configured to distribute heat substantially evenly between the base half 32 and the top cover half 34.

The thermal control system therein is best illustrated by FIGS. 2-7, according to embodiments. Referring to FIG. 2, FIG. 2 is top view diagram of a thermal control system 108 depicting a heat sink assembly 110 without PCB 52 and enclosure ("clamshell") 30. As shown in FIG. 3, the heat sink assembly 110 includes a primary side cooling plate 54 and a secondary side cooling plate 56 positioned on top of each other with a gap therebetween. Typically, plates 54, 56 are metal to provide sufficient thermal conduction.

A heat distributing mechanism 58 is configured to distribute heat substantially evenly between the base half 32 and top cover half 34. The heat distributing mechanism 58 may include, e.g., a heat pipe, pumped fluid, a vapour chamber, a thermosyphone, and a loop heat pipe. Typically, the heat distributing mechanism 58 is a heat pipe.

In general, a heat pipe is a heat-transfer device that combines the principles of thermal conductivity and phase transition to effectively transfer heat between two solid interfaces. At the hot interface of a heat pipe, a liquid in contact with a thermally conductive solid surface turns into a vapor by absorbing heat from that surface. The vapor then travels along the heat pipe to the cold interface and condenses back into a liquid, releasing the latent heat. The liquid then returns to the hot interface through either capillary action, centrifugal force, or gravity, and the cycle repeats. Due to the very high heat transfer coefficients for boiling and condensation, heat pipes are highly effective thermal conductors. Heat pipes can advantageously move heat away from components to heat sinks where thermal energy may be dissipated into the environment.

FIGS. 2-7 and 9-11 depict a first embodiment of heat distributing mechanism 58 as a heat pipe. FIGS. 24-26 depict a second embodiment of the heat distributing mechanism 58, as further described below.

According to embodiments and with references to FIGS. 2-7 and 9-11, the heat distributing mechanism 58 is a heat pipe. While FIGS. 2-7 and 9-11 show two heat pipes, single and multiple heat pipes are also contemplated. For instance, FIGS. 24-26 disclose four heat pipes as further described below, and other amounts are possible.

Moreover, while certain configurations of the heat pipe are set forth below, it will be appreciated that others are contemplated. Also, as described below the heat pipe can be attached to the primary side cooling plate 54 and the secondary side cooling plate 56. Surface contact therewith is thereby provided. Any suitable mechanisms of attachment/securing are contemplated.

[*Inventors, please further describe how heat pipe is attached to the plates]

According to embodiments, the heat pipe comprises a first section 60 attached to an end 62 of the primary side cooling plate 54, a first elongated section 64 extending along a side length 66 of the primary side cooling plate 54, a first bend segment 68, a second elongated section 70 extending along a side length 72 of the secondary side cooling plate 56, a second section 74 attached to an end 76 of an underside of the secondary side cooling plate 56.

This is a second heatpipe that mirrors the first heatpipe 60, 66, 68, 70

The first bend segment 68 and the second bend segment 88 each extend past the primary side cooling plate 54, the secondary side cooling plate 56 and the PCB 52, as shown in FIG. 6, and the heat pipe is fully enclosed by the hardened optical clamshell platform 12 as best seen in FIGS. 9-11.

As shown best in FIG. 4, at least two spring guiding standoffs 98 are located on the PCB (52) below the primary side cooling plate 54 to support the primary side cooling plate 54 during installation, before the cooling plates can be fastened to the clamshells. Thus, the spring guiding standoffs 98 can provide temporary support so that, e.g., the primary side cooling plate 54 does not collapse on itself and can also be positioned therein to avoid providing stress on the heat pipe. A spring support 100 is located on the primary side cooling plate 54 supporting each guiding standoff 98. FIG. 4 further shows a thermal pad 104 coupled to the secondary side cooling plate 56.

Advantageously, and as shown in FIG. 5, each of the spring guiding standoffs 98 can go through the PCB 52 to be attached to the secondary side plate supports 55 without the pcb in the tolerance loop for tolerance mitigation, and fasteners 102 attach the PCB 52 to the secondary side cooling plate supports 55. FIG. 6 show a bottom view of FIG. 5, and FIG. 7 is a perspective view diagram showing FIG. 5 assembled to the lower side of the enclosure ("clamshell") 30 with fasteners 102.

FIG. 8 is a perspective view diagram of FIG. 7 with the top cover half 34 of the enclosure ("clamshell") 30 assembled thereon. FIG. 9 is a cross-sectional diagram of FIG. 8 with top cover half 34 and base half 32 of the enclosure ("clamshell") 30. FIG. 10 is a cross-sectional diagram (hidden line view) of FIG. 8 with top cover half 34 and base half 32 of the enclosure ("clamshell") 30. FIG. 11 is a perspective view of an optical or telecommunications platform 12 with top cover half 34 and base half 32 of the enclosure ("clamshell") 30 including heat distributing mechanism 58 therein.

Thus, according to embodiments and with reference to FIGS. 2-11, a thermal control system 108 for pluggable optics and/or a Printed Circuit Board (PCB) 52 in a outdoor, hardened telecommunications clamshell platform 12 comprises a heatsink assembly 110 for dissipating heat from the PCB in the hardened telecommunications clamshell platform 12, wherein the hardened telecommunications clamshell platform 12 comprises a base half 32 and a top cover half 34, each half having outer fins 36 thereon. The heatsink assembly 110 comprises a primary side cooling plate 54 having a primary side underside; a secondary side cooling plate 54 having a secondary side underside; a spring guiding standoff 98 attached on each end of the underside of the primary side cooling plate 62; a heat distributing mechanism 58 coupled to the primary side cooling plate 54 and the secondary side cooling plate 56 and surrounding the PCB 52. The PCB 52 is located between the primary side cooling plate 54 and the secondary side cooling plate 56, and each spring guiding standoff 98 goes through the PCB 52 to be attached to the secondary side cooling plate support 55 for tolerance mitigation. Such springs also provide a mechanism to assist in assembly and prevent damage during, e.g., factory installation, etc.

Fasteners 102 attach the PCB 52 to the secondary side cooling plate support 55 forming a PCB assembly 112, as best seen in FIG. 5. The PCB assembly 112 is attached with fasteners 102 to the base half 32 of the hardened optical clamshell platform 12, as shown in FIG. 7.

Advantageously, a high clamping force is provided by the fasteners 102, which again may be any suitable screws or other suitable fastening devices, as well as a low thermal resistance path.

The top cover half 34 of the hardened telecommunications clamshell platform 12 is attached with fasteners 102 to the primary side cooling plate 54 through the top cover half 34, as shown in FIG. 8. Advantageously, the heat distributing mechanism 58 is configured to distribute thermal load generated by the PCB 52 to both the base half 32 and the top cover half 34 of the hardened optical clamshell platform 12 such that heat is distributed substantially evenly to the base half 32 and the top cover half 34. According to embodiments, the base half (32) is configured to initially receive the heat from the PCB (52) and the distribution mechanism (58) is configured to then distribute the heat to the top cover half (34) such that the heat is distributed substantially evenly between the base half (32) and the top cover half (34).

For example, with reference to FIG. 9, heat is conducted from PCB 52, which could also have a number of additional components associated therewith, down to the secondary side cooling plate 56 through the spring guiding standoff 98. It is noted that there could be multiple standoffs 98, for instance, two as shown in FIG. 9, and possibly more. Plate 56 could also have, e.g., one or more copper indents therein. When the heat reaches the secondary side cooling plate 56, the heat distributing device 58 spreads the heat over the base half 32 or bottom surface of the enclosure ("clamshell") 30, conducts the heat and also spreads the heat over to the top cover half 34 or top surface of the enclosure ("clamshell") 30 via the U bend portions of the heat pipe (e.g., via the first bend segment 68 and the second bend segment 88 shown in representative FIG. 3) which can bring the heat up to the plate 54. The heat can be effectively spread over the surfaces of fins 36. Advantageously, the heat pipe can be routed in a loop between surfaces of the two cooling plates (54, 56) making contact therewith.

A further advantage of embodiments is that the fasteners 102, such as screws, pins or other suitable fastening devices, bring the primary side cooling plate 54 (hot plate) in contact with the clamshell greatly diminishing contact resistance and providing a very effective thermal path.

Thus, advantageously, a heat sink can be provided on both sides of the enclosure ("clamshell") 30. According to embodiments, the inventors have determined an effective connection between the base half 32 and the top cover half 34 of enclosure 30 coupled with the referenced heat pipe to effectively and substantially evenly get heat into both halves of the enclosure 30 and thus distribute the thermal load substantially evenly to both halves. Accordingly, the surface area is effectively doubled as now the thermal load is disturbed evenly to both halves of the enclosure 30. Accordingly, the inventors have advantageously determined how to take the heat from, e.g., a single PCB and distribute it substantially evenly among two halves of an enclosure 30 of an outdoor, hardened telecommunications or optic platform 12, and thus get the heat up and out of the enclosure 30 with an effective heat distributing mechanism 58.

Referring now to FIGS. 24-27, FIG. 24 is a perspective diagram of a thermal control system 109 depicting a heat sink assembly 111 without PCB 52 and enclosure ("clamshell") 30, according to another embodiment. FIG. 25 is a perspective diagram of the top view of FIG. 24 with the heat sink assembly 111 assembled to a PCB 52; and FIG. 26 is a side view of the embodiment of FIG. 25 and depicting an optical or telecommunications platform 12 with heat sink assembly 111 assembled to a PCB 52 with an enclosure ("clamshell") 30. As noted above, the use of multiple heat pipes are possible. For example, FIGS. 24-27 depict four heat pipes.

Advantageously, FIG. 24 depicts a heat sink assembly 111 comprising a "heat spreader." This heat spreader is a customized and low cost heat spreader which can transport heat on both halves (base half 32 and top cover half 34) of enclosure ("clamshell") 30 quickly. The primary side cooling plate 54 (top plate) and secondary side cooling plate 56 (bottom plate) of the heat spreader are attached with four heat pipes and have U shape to induce vertical flexibility. These heat pipes are 25 to 50× times conductive compared with copper. As shown in FIG. 25, the PCB 52 is inserted in position between plates 54, 56 and held with four springs 99. This way, the PCB 52 is pushed towards the bottom resulting in a low thermal resistance path between the PCB 52 and any associated components and the base half 32 of the enclosure ("clamshell"). The assembled PCB 52 is mounted on the base half 32 tightly with screws, etc., the PCB 52 and a conduction path is formed between the PCB 52 and any associated components and the lower base half 32. When the top cover half 34 is mounted over the base half 32 with suitable screws, fasteners or the like, the primary side cooling plate 54 (top plate) of the heat spreader makes a lap/pressure joint improving heat transfer characteristics between the top cover half 34 and the heat spreader (see FIG. 26). This way, an efficient conduction heat transfer path gets established from the PCB 52 and any associated components to the top cover half 34.

Advantageously, according to embodiments, the thermal challenge is offset by a custom design, low cost heat spreader that integrates enclosure surfaces thermally (top and bottom half, 34, 32). The custom design of such a heat spreader provides spring load over the electronic components and dissipating surfaces, and thereby improves heat transfer coefficient. This way, all surfaces of the enclosure 30 can participate in heat dissipation substantially equally and this helps in reducing size and weight of the enclosure 30.

Further advantages of embodiments include providing a unique method of heat transport mechanism to all external surfaces of the enclosure 30 in a balanced way, low cost design that helps in reducing size, weight and cost of enclosure 30, as well as ease of installation on, e.g., a pole or strand.

FIG. 27 is a flow diagram of a process 114 of distributing heat substantially evenly between a base half 32 and a top cover half 34 of an outdoor, hardened telecommunications clamshell platform 12. As disclosed therein, the process 114 comprises at 116 providing the base half 32 and the top cover half 34 of the outdoor, hardened telecommunications clamshell platform 12, each half having outer fins 36 thereon. The process 114 further comprises at 118 providing a Printed Circuit Board (PCB) 52 disposed between two cooling plates 54, 56 within the platform 12; and providing a heat distributing mechanism 58 surrounding the PCB 52 within the platform 12, wherein the heat distributing mechanism 58 distributes the heat substantially evenly between the base half 32 and the top cover half 34 of the outdoor, hardened telecommunications clamshell platform 12.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, processor, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

Moreover, it is noted that the various elements described herein can be used in any and all combinations with each other.

What is claimed is:

1. An outdoor, hardened telecommunications clamshell platform comprising:
   a base half and a top cover half, configured to dissipate heat;
   a Printed Circuit Board (PCB) disposed between two cooling plates that are enclosed by the base half and the top cover half; and
   a heat distributing mechanism surrounding the PCB configured to distribute heat substantially evenly between the base half and the top cover half, wherein the heat distributing mechanism includes:
      a first section attached to an end of the primary side cooling plate;
      a first elongated section extending along a side length of the primary side cooling plate;
      a first bend segment;
      a second elongated section extending along a side length of the secondary side cooling plate;
      a second section attached to an end of an underside of the secondary side cooling plate; and
      a second bend segment;
      wherein the first bend segment and the second bend segment each extend past the primary side cooling plate, the secondary side cooling plate and the PCB, and the heat distributing mechanism is enclosed by the hardened telecommunications clamshell platform.

2. The outdoor, hardened telecommunications clamshell platform of claim 1, wherein the base half is configured to initially receive the heat from the PCB and the heat distribution mechanism is configured to then distribute the heat to the top cover half.

3. The outdoor, hardened telecommunications clamshell platform of claim 1, wherein the heat distributing mechanism is selected from the group consisting of a heat pipe, pumped fluid, a vapour chamber, a thermosyphone, and a loop heat pipe.

4. The outdoor, hardened telecommunications clamshell platform of claim 1, wherein the heat distributing mechanism is a heat pipe.

5. The outdoor, hardened telecommunications clamshell platform of claim 1, wherein the heat distributing mechanism includes a plurality of sections and a plurality of segments.

6. The outdoor, hardened telecommunications clamshell platform of claim 1, wherein each of the spring guiding standoffs go through the PCB to be attached to the secondary side heatsink supports for tolerance mitigation; and
   wherein fasteners attach the PCB to the secondary side cooling plate.

7. The outdoor, hardened telecommunications clamshell platform of claim 1, comprising a thermal pad coupled to the secondary side cooling plate.

8. The outdoor, hardened telecommunications clamshell platform of claim 1, wherein at least two spring guiding standoffs are located on the PCB below the primary side cooling plate to support the primary side cooling plate for thermal contact, and a spring support is located on the primary side cooling plate supporting each guiding standoff.

9. The outdoor, hardened telecommunications clamshell platform of claim 1, wherein the base half is configured to initially receive the heat from the PCB and the heat distribution mechanism is configured to then distribute the heat to the top cover half such that the heat is distributed substantially evenly between the base half and the top cover half.

10. The outdoor, hardened telecommunications clamshell platform of claim 1, wherein the heat distributing mechanism is routed in a loop between surfaces of the two cooling plates making contact therewith.

11. The outdoor, hardened telecommunications clamshell platform of claim 1, further comprising one or more openings configured to connect to hardened external cabling that includes fibers therein.

12. A thermal control system for pluggable optics and a Printed Circuit Board (PCB) in an outdoor, hardened telecommunications clamshell platform, the thermal control system comprising:
   a heatsink assembly for dissipating heat from the PCB, wherein the hardened telecommunications clamshell platform comprises a base half and a top cover half; the heatsink assembly comprising
      a primary side cooling plate having a primary side underside;
      a secondary side cooling plate having a secondary side underside;
      a spring guiding standoff attached on each end of the underside of the primary side cooling plate;
      a heat distributing mechanism coupled to the primary side cooling plate and the secondary side cooling plate and surrounding the PCB;
   the PCB located between the primary side cooling plate and the secondary side cooling plate, wherein each spring guiding standoff goes through the PCB to attach the primary side cooling plate to the PCB,
   wherein the heat distributing mechanism includes
      a first section attached to an end of the primary side cooling plate, a first elongated section extending along a side length of the primary side cooling plate, a first bend segment, a second elongated section extending along a side length of the secondary side cooling plate, a second section attached to an end of an underside of the secondary side cooling plate; and
      a third section attached to an end of the primary side cooling plate and aligned with the first section, a third elongated section extending along a side length of the primary side cooling plate opposite and parallel to the first elongated section, a second bend segment parallel to the first bend segment, a fourth elongated section extending along a side length of the secondary side cooling plate opposite the second elongated section, a fourth section attached to an end of the underside of the secondary side cooling plate and aligned with the second section,
   wherein the first bend segment and the second bend segment each extend past the primary side cooling plate, the secondary side cooling late and the PCB, and the heat distributing mechanism is enclosed by the hardened telecommunications clamshell platform.

13. The thermal control system of claim 12, wherein the heat distributing mechanism is a heat pipe.

14. The thermal control system of claim 12, wherein the base half is configured to initially receive the heat from the PCB and the distribution mechanism is configured to then distribute the heat to the top cover half.

15. The thermal control system of claim 12, wherein the heat distributing mechanism is routed in a loop between surfaces of the two cooling plates making contact therewith.

16. A method of distributing heat substantially evenly between a base half and a top cover half of an outdoor, hardened telecommunications clamshell platform comprising:
- providing the base half and the top cover half of the outdoor, hardened telecommunications clamshell platform;
- providing a Printed Circuit Board (PCB) disposed between two cooling plates within the platform; and
- providing a heat distributing mechanism surrounding the PCB within the platform, wherein the heat distributing mechanism distributes the heat substantially evenly between the base half and the top cover half of the hardened telecommunications platform, wherein the heat distributing mechanism includes
- a first section attached to an end of the primary side cooling plate:
- a first elongated section extending along a side length of the primary side cooling plate;
- a first bend segment;
- a second elongated section extending along a side length of the secondary side cooling plate;
- a second section attached to an end of an underside of the secondary side cooling plate; and
- a second bend segment:

wherein the first bend segment and the second bend segment each extend past the primary side cooling plate, the secondary side cooling plate and the PCB, and the heat distributing mechanism is enclosed by the hardened telecommunications clamshell platform.

17. The method of claim 16, wherein the heat distributing mechanism is a heat pipe.

* * * * *